US011955551B2

(12) United States Patent
Vellianitis et al.

(10) Patent No.: US 11,955,551 B2
(45) **Date of Patent: *Apr. 9, 2024**

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Georgios Vellianitis, Heverlee (BE); Gerben Doornbos, Kessel-Lo (BE); Marcus Van Dal, Linden (BE)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/855,804

(22) Filed: Jul. 1, 2022

(65) Prior Publication Data

US 2022/0336654 A1 Oct. 20, 2022

Related U.S. Application Data

(63) Continuation of application No. 16/426,634, filed on May 30, 2019, now Pat. No. 11,387,362.

(Continued)

(51) Int. Cl.

*H01L 29/78* (2006.01)
*B82Y 10/00* (2011.01)

(Continued)

(52) U.S. Cl.

CPC .......... *H01L 29/785* (2013.01); *H01L 21/845* (2013.01); *H01L 29/1608* (2013.01);

(Continued)

(58) Field of Classification Search

CPC . H01L 29/785; H01L 21/845; H01L 29/1608; H01L 29/41791; H01L 29/42356;

(Continued)

(56) References Cited

U.S. PATENT DOCUMENTS

| | | | |
|---|---|---|---|
| 9,236,267 | B2 | 1/2016 | De et al. |
| 9,412,849 | B1 | 8/2016 | Suk et al. |

(Continued)

FOREIGN PATENT DOCUMENTS

| | | | |
|---|---|---|---|
| CN | 107464840 | A | 12/2017 |
| CN | 108122967 | A | 6/2018 |

(Continued)

OTHER PUBLICATIONS

Non-Final Office Action issued in U.S. Appl. No. 16/426,634, dated Jul. 10, 2020.

(Continued)

*Primary Examiner* — Herve-Louis Y Assouman
(74) *Attorney, Agent, or Firm* — STUDEBAKER & BRACKETT PC

(57) ABSTRACT

A semiconductor device includes a gate-all-around field effect transistor (GAA FET). The GAA FET includes channel regions made of a first semiconductor material disposed over a bottom fin layer made of a second semiconductor material, and a source/drain region made of a third semiconductor material. The first semiconductor material is $Si_{1-x}Ge_x$, where $0.9 \leq x \leq 1.0$, and the second semiconductor material is $Si_{1-y}Ge_y$, where $y < x$ and $0.3 \leq y \leq 0.7$.

20 Claims, 21 Drawing Sheets

75 86 84 82 20 76 78 10 11 68 90 50 30 Z Y X

Related U.S. Application Data

(60) Provisional application No. 62/774,134, filed on Nov. 30, 2018.

(51) Int. Cl.

| | |
|---|---|
| ***H01L 21/8238*** | (2006.01) |
| ***H01L 21/84*** | (2006.01) |
| ***H01L 29/16*** | (2006.01) |
| ***H01L 29/417*** | (2006.01) |
| ***H01L 29/423*** | (2006.01) |
| ***H01L 29/66*** | (2006.01) |
| ***H01L 29/775*** | (2006.01) |
| ***H01L 29/786*** | (2006.01) |

(52) U.S. Cl.
CPC .. *H01L 29/41791* (2013.01); *H01L 29/42356* (2013.01); *H01L 29/66795* (2013.01); *H01L 2029/7858* (2013.01)

(58) Field of Classification Search
CPC ....... H01L 29/66795; H01L 2029/7858; H01L 21/823807; H01L 21/823814; H01L 29/42392; H01L 29/66545; H01L 27/092; H01L 29/0673; H01L 29/161; H01L 29/165; H01L 29/66439; H01L 29/775; H01L 29/7848; H01L 29/78696; B82Y 10/00
See application file for complete search history.

(56) References Cited

U.S. PATENT DOCUMENTS

| | | | | |
|---|---|---|---|---|
| 9,502,265 | B1 | 11/2016 | Jiang et al. | |
| 9,520,466 | B2 | 12/2016 | Holland et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 9,627,540 | B1 | 4/2017 | Chen et al. | |
| 9,711,608 | B1 | 7/2017 | Duriez et al. | |
| 9,786,774 | B2 | 10/2017 | Colinge et al. | |
| 9,853,101 | B2 | 12/2017 | Peng et al. | |
| 9,881,993 | B2 | 1/2018 | Ching et al. | |
| 10,431,683 | B2 | 10/2019 | Reboh et al. | |
| 11,158,742 | B2 | 10/2021 | Cheng et al. | |
| 11,183,599 | B2 | 11/2021 | Chen et al. | |
| 11,387,362 | B2 * | 7/2022 | Vellianitis | H01L 29/66545 |
| 2013/0277714 | A1 | 10/2013 | Le et al. | |
| 2014/0239255 | A1 | 8/2014 | Kang et al. | |
| 2015/0084041 | A1 | 3/2015 | Hur et al. | |
| 2015/0311341 | A1 | 10/2015 | Hur et al. | |
| 2016/0027929 | A1 | 1/2016 | Cheng et al. | |
| 2016/0111513 | A1 | 4/2016 | Liu et al. | |
| 2017/0047402 | A1 | 2/2017 | Yang et al. | |
| 2017/0104061 | A1 * | 4/2017 | Peng | H01L 29/0649 |
| 2017/0133375 | A1 | 5/2017 | Fung | |
| 2017/0162447 | A1 | 6/2017 | Glass et al. | |
| 2017/0186603 | A1 | 6/2017 | Moon et al. | |
| 2017/0256609 | A1 | 9/2017 | Bhuwalka et al. | |
| 2017/0358646 | A1 | 12/2017 | Fung | |
| 2017/0365604 | A1 | 12/2017 | Suh et al. | |
| 2018/0151706 | A1 | 5/2018 | Lin et al. | |
| 2018/0366375 | A1 | 12/2018 | Chen et al. | |

FOREIGN PATENT DOCUMENTS

| | | | |
|---|---|---|---|
| CN | 108231894 | A | 6/2018 |
| DE | 10 2019 122 949 | A1 | 4/2020 |
| FR | 3060838 | A1 | 6/2018 |
| KR | 10-2015-0033496 | A | 4/2015 |
| KR | 10-2015-0124049 | A | 11/2015 |
| KR | 10-2017-0069888 | A | 6/2017 |
| TW | 201730956 | A | 9/2017 |
| WO | 2018/164656 | A1 | 9/2018 |

OTHER PUBLICATIONS

Final Office Action issued in U.S. Appl. No. 16/426,634, dated Dec. 9, 2020.

Non-Final Office Action issued in U.S. Appl. No. 16/426,634, dated May 11, 2021.

Final Office Action issued in U.S. Appl. No. 16/426,634, dated Oct. 5, 2021.

Notice of Allowance issued in U.S. Appl. No. 16/426,634, dated Mar. 4, 2022.

* cited by examiner

SEMICONDUCTOR DEVICE AND MANUFACTURING METHOD THEREOF

RELATED APPLICATIONS

This application is a continuation of U.S. patent application Ser. No. 16/426,634 filed May 30, 2019, now U.S. Pat. No. 11,387,362, which claims priority to U.S. Provisional Application No. 62/774,134 filed Nov. 30, 2018, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. The fourth side (e.g., the bottom part) of the channel, however, is far away from the gate electrode and thus is not under close gate control. In contrast, in a GAA FET, all side surfaces of the channel region are surrounded by the gate electrode, which allows for fuller depletion in the channel region and results in less short-channel effects due to a steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 2:
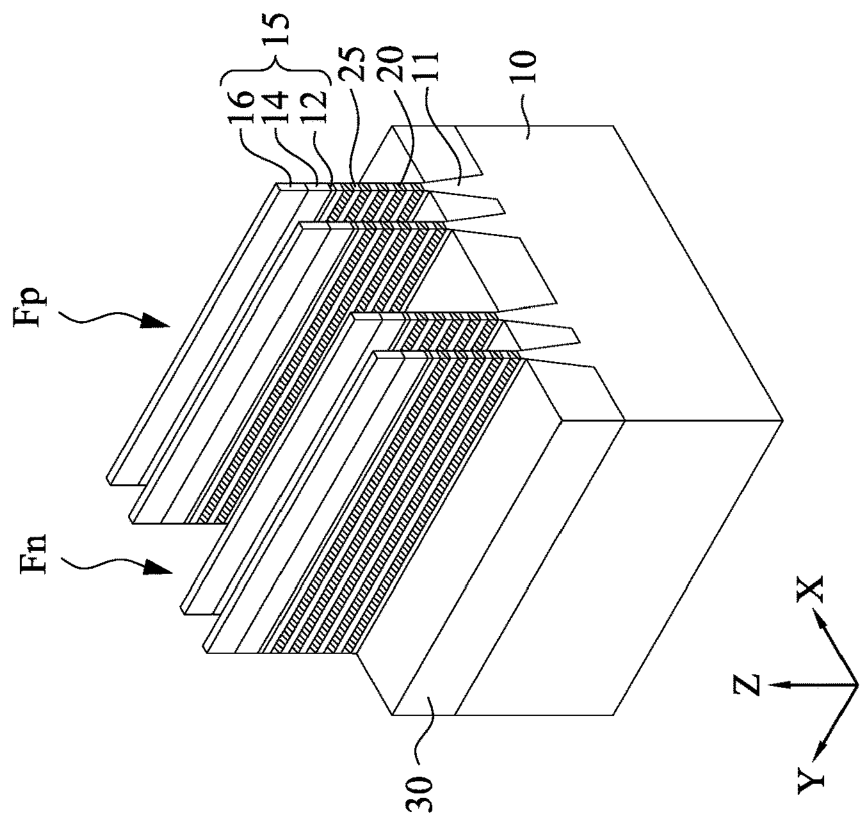
FIG. 2 shows one of the various stages of sequential manufacturing process of a GAA FET device according to embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain.

In various GAA FETs using nanowires, germanium (Ge) nanowires are promising candidates to replace Si and/or SiGe nanowires because Ge exhibits higher hole and electron mobility than $Si_{1-x}Ge_x$ ($0 \le x < 1$) and nanowires offer superior electrostatics at a short gate length. In a practical use of Ge nanowires, the Ge nanowires may need to be strained to offer benefits in power and performance when compared with strained nanowires made of Si and SiGe (e.g., a tensile strained Si nFET and a compressive strained SiGe pFET).

In the present disclosure, a method and a structure for a CMOS GAA FET having a tensile strained Ge nFET and a compressive strained Ge pFET are procided. In some embodiments, channel regions are made of Ge, and in other embodiments, channel are made of SiGe having a high Ge concentration (e.g., $Si_{1-x}Ge_x$ ($0.9 \le x < 1$)).

Channel regions of nanowire GAA FETs can be tensile strained or compressive strained by disposing a strain material on source/drain regions of the nanowires and/or by introducing stress originating from a substrate into the nanowires when alternatingly forming different semiconductor layers (channel semiconductor layers and sacrificial layers).

When a substrate, channel regions, p-type source/drain epitaxial layers and n-type source/drain epitaxial layers are made of the same material, e.g., $Si_{1-x}Ge_x$ ($0 \le x \le 1$), the channel regions of the pFETs and the nFETs are both relaxed without stress. By using $Si_{1-y}Ge_y$ ($y < x$) or SiC as the source/drain epitaxial layer in the nFETs, it is possible to introduce tensile stress to the nFETs. By using GeSn or SiGeSn as the source/drain epitaxial layer in the pFETs, it is possible to introduce compressive stress to the pFETs.

When the substrate and the channel regions are made of different materials, it is possible to introduce stress to the channel regions. For example, when the substrate is made of $Si_{1-z}Ge_z$ and the channel regions are made of $Si_{1-x}Ge_x$, where $0 \le z \le x \le 1$, the channel regions are compressively stressed.

FIGS. 1-15C show various stages for a sequential manufacturing process of a GAA FET device according to embodiments of the present disclosure. It is understood that in the sequential manufacturing process, one or more additional operations can be provided before, during, and after the stages shown in FIGS. 1-15C, and some of the operations described below can be replaced or eliminated for additional embodiments of the method. The order of the operations/processes may be interchangeable. In the embodiments of FIGS. 1-15C, the channel regions of pFETs are compressive strained introduced by the substrate and the channel regions of nFETs are tensile strained by forming a different semiconductor material on the source/drain regions.

Figure 1:
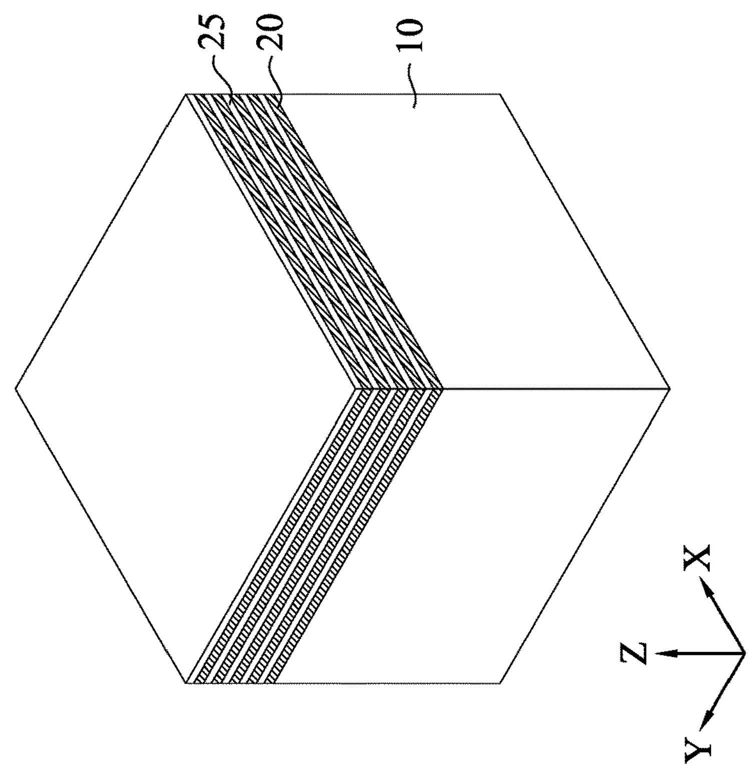
FIG. 1 shows one of the various stages of sequential manufacturing process of a GAA FET device according to embodiments of the present disclosure.

As shown in FIG. 1, stacked semiconductor layers are formed over a substrate 10. The stacked semiconductor layers include first crystalline semiconductor layers 20 and second crystalline semiconductor layers 25.

In one embodiment, substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiment, the substrate 10 or at least the surface portion thereof is made of $Si_{1-y}Ge_y$, where y is in a range from about 0.3 to about 0.7 in some embodiments, and x is in a range from about 0.4 to about 0.6 in other embodiments.

In some embodiments, the first semiconductor layers 20 and the second semiconductor layers 25 are made of Si, a Si compound, SiGe, Ge or a Ge compound. In some embodiments, the first semiconductor layers 20 are $Si_{1-x}Ge_x$, where x is greater than y and is in a range from about 0.9 to about 1.0. In some embodiments, the second semiconductor layers 25 are $Si_{1-z}Ge_z$, where z is equal to or smaller than y and is in a range from about 0.3 to about 0.7 and is in a range from about 0.4 to about 0.6 in other embodiments. In some embodiments, y=z. In certain embodiments, the first semiconductor layers 20 are made of Ge.

In FIG. 1, five layers of the first semiconductor layer 20 and five layers of the second semiconductor layer 25 are disposed. However, the number of the layers are not limited to five, and may be as small as 1 (each layer). In some embodiments, 2-20 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 30 nm in some embodiments, and is in a range from about 10 nm to about 20 nm in other embodiments. The thickness of the second semiconductor layers 25 is in a range from about 5 nm to about 30 nm in some embodiments, and is in a range from about 10 nm to about 20 nm in other embodiments. The thickness of each of the first semiconductor layers 20 may be the same, or may vary. In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, and is in a range from 20 nm to 40 nm in other embodiments.

In some embodiments, the thicknesses of the first semiconductor layers 20 and the second semiconductor layer 25 are less than the critical thicknesses. The critical thickness is a maximum thickness of an epitaxially formed layer without causing dislocations. When the thickness of the epitaxial layer is less than the critical thickness, the lattice information (e.g., lattice constant) of the epitaxial layer is substantially the same as the lattice information of the underlying layer (substrate), and thus the epitaxially formed layer is strained. For example, when the substrate is SiGe and the first semiconductor layer 20 is made of Ge, the Ge first semiconductor layer 20 is compressive strained when the thickness of the Ge first semiconductor layer is less than the critical thickness. Further, when the second semiconductor layer 25 is made of SiGe, the SiGe second semiconductor layer 25 epitaxially formed on the Ge first semiconductor layer has substantially the same lattice information and thus is relaxed. By alternately forming Ge first semiconductor layers 20 and SiGe second semiconductor layers 25 on the SiGe substrate 10, it is possible to introduce compressive stress to the first semiconductor layers, which are subsequently used as channel regions.

FIG. 2 shows a perspective view of one of the various stages of sequential manufacturing process of a GAA FET device according to embodiments of the present disclosure.

A mask layer 15 is formed over the stacked layers. In some embodiments, the mask layer 15 includes a first mask layer 12, a second mask layer 14 and a third mask layer 16. The first mask layer 12 is a pad oxide layer made of a silicon oxide, which can be formed by a thermal oxidation. The second mask layer 14 is made of a silicon nitride (SiN) and the third mask layer 16 is made of a silicon oxide, both of which are formed by chemical vapor deposition (CVD), including low pressure CVD (LPCVD) and plasma enhanced CVD (PECVD); physical vapor deposition (PVD); atomic layer deposition (ALD); or other suitable process. The mask layer 15 is patterned into a mask pattern by using patterning operations including photolithography and etching.

As shown in FIG. 2, the stacked layers of the first and second semiconductor layers 20, 25 are patterned by using the patterned mask layer 15, thereby the stacked layers are formed into fin structures Fn and Fp extending in the Y direction. In the subsequent fabrication operations, the fin structure Fn is used to form an n-type FET, and the fin structure Fp is used to formed a p-type FET. Each of the fin structures includes a bottom fin layer 11, which is a part of the etched substrate 10. In some embodiments, at a minimum, the bottom fin layer 11 is made of $Si_{1-x}Ge_x$.

The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

The width W1 of the fin structure along the X direction is in a range from about 5 nm to about 40 nm in some embodiments, and is in a range from about 6 nm to about 15 nm in other embodiments. The height H1 along the Z direction of the entire fin structure is in a range from about 30 nm to about 200 nm.

In FIG. 2, two fin structures Fn and two fin structure Fp are disposed. However, the number of the layers are not limited to two, and may be as small as 1. The number of the fin structures Fn and Fp may be the same or different from each other.

Figure 3:
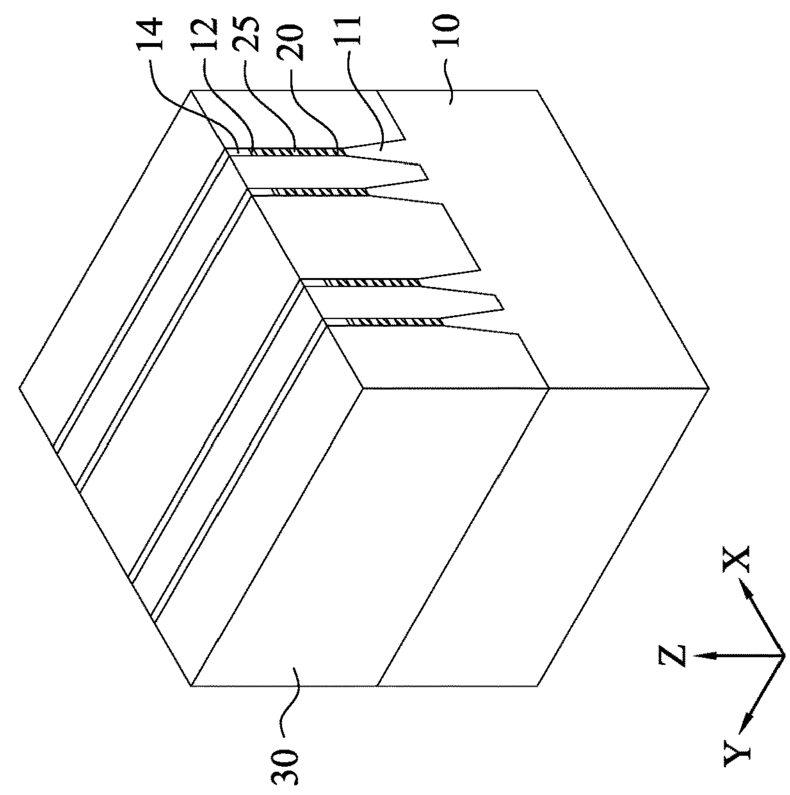
FIG. 3 shows one of the various stages of sequential manufacturing process of a GAA FET device according to embodiments of the present disclosure.

FIG. 3 one of various stages of sequential manufacturing process a GAA FET device according to one embodiment of the present disclosure.

After the fin structures are formed, an isolation insulating layer (shallow trench isolation, STI) 30 including one or more layers of insulating material is formed over the substrate so that the fin structures are fully embedded in the insulating layer 50. The insulating material for the insulating layer 30 may include silicon oxide, silicon nitride, silicon oxynitride (SiON), SiOCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer 30. Then, a planarization operation, such as a chemical mechanical polishing (CMP) method and/or an etch-back method, is performed such that the upper surface of the second mask layer 14 is exposed from the insulating material layer, as shown in FIG. 3. In some embodiments, the upper surface of the fin structures or the first mask layer 12 is exposed.

In some embodiments, a first liner layer is formed over the structure of FIG. 3 and a second liner layer is further formed over the first liner layer. The first liner layer is made of silicon oxide or a silicon oxide-based material and the second liner layer is made of SiN or a silicon nitride-based material. In some embodiments, the second liner layer is made of silicon oxide or a silicon oxide-based material and the first liner layer is made of SiN or a silicon nitride-based material.

Figure 4:
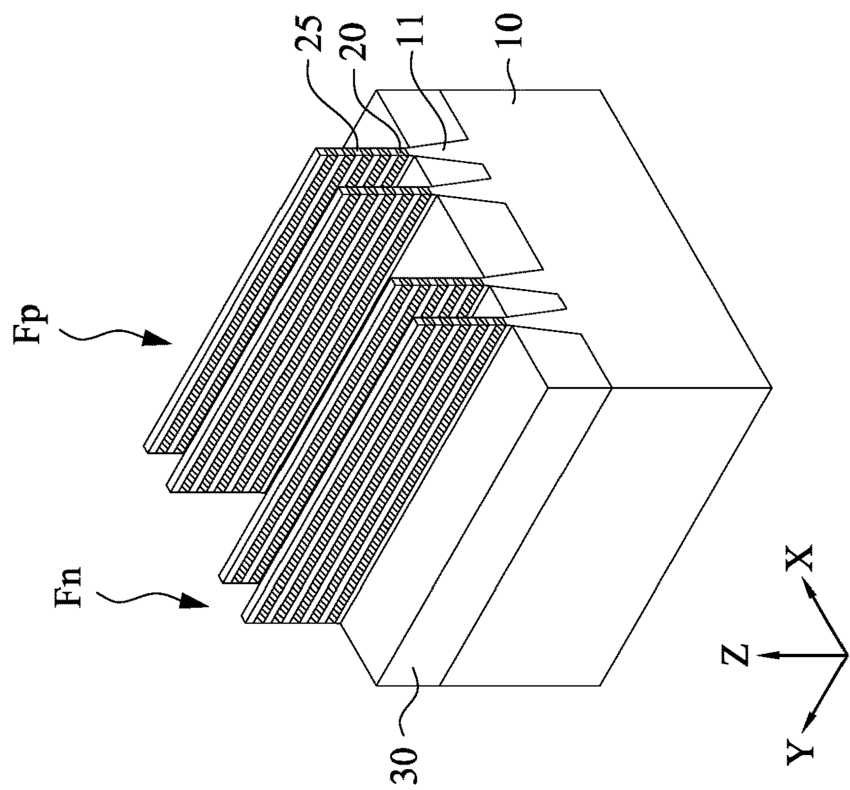
FIG. 4 shows one of the various stages of sequential manufacturing process of a GAA FET device according to embodiments of the present disclosure.

FIG. 4 shows one of various stages of sequential manufacturing process of a GAA FET device according to one embodiment of the present disclosure. As shown in FIG. 4, the insulating layer 30 is recessed to partially expose an upper part of the fin structures. The exposed portions include the stacked structure of the first semiconductor layers 20 and the second semiconductor layers 25. As shown in FIG. 4, the bottommost first semiconductor layer 20 is fully exposed from the isolation insulating layer 30. In some embodiments, a part of the top of the bottom fin structure 11 is exposed from the isolation insulating layer 30. In other embodiments, the bottommost first semiconductor layer is partially embedded in the isolation insulating layer 30.

Figure 5B:
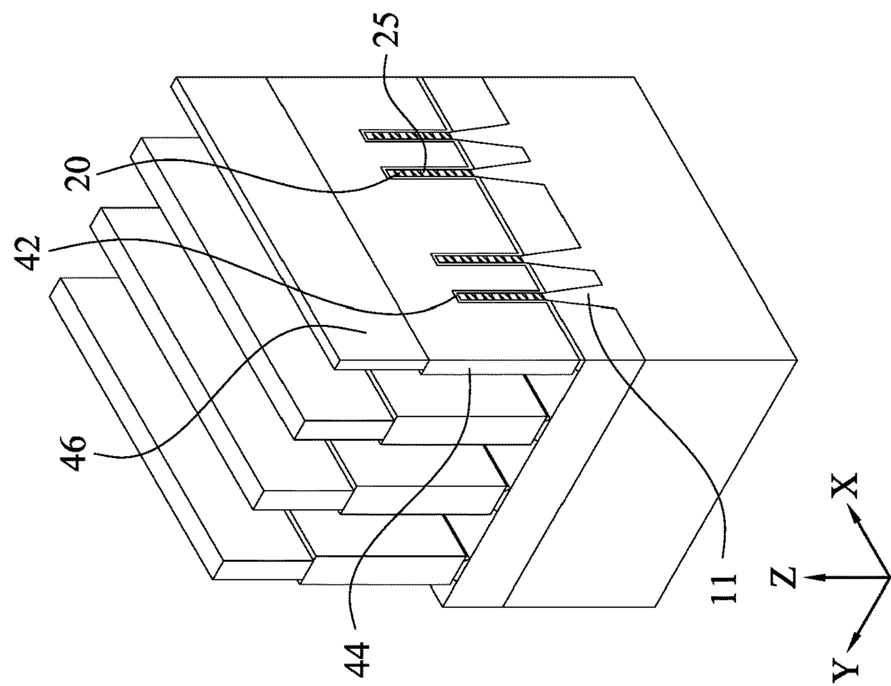
FIGS. 5A and 5B show one of the various stages of sequential manufacturing process of a GAA FET device according to embodiments of the present disclosure.
Figure 5A:
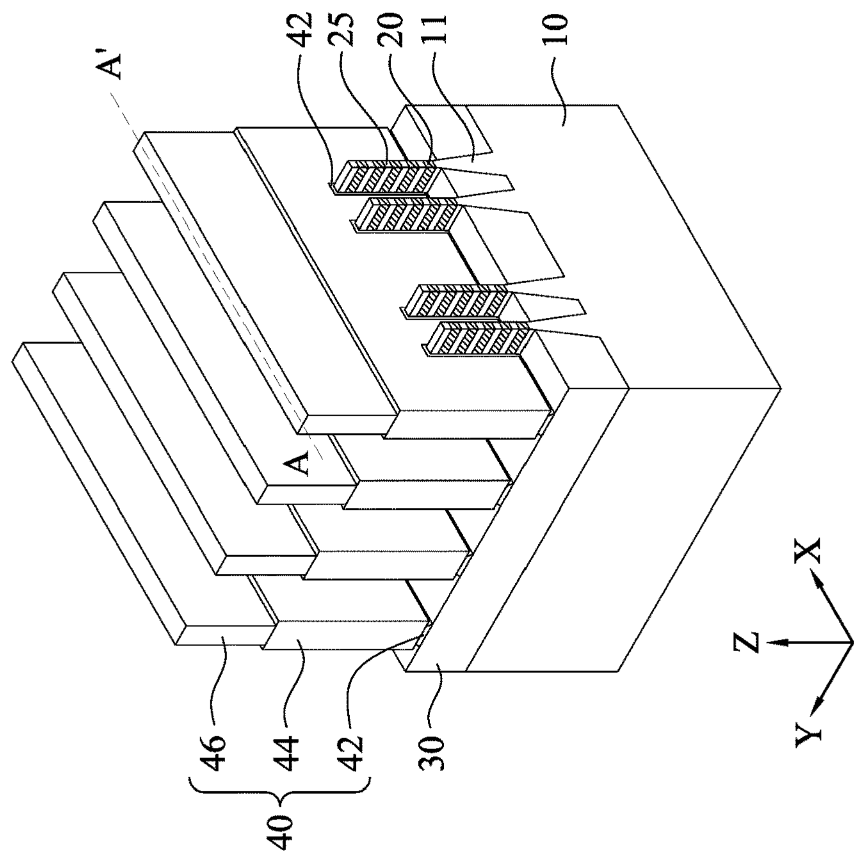

FIGS. 5A and 5B show one of various stages of sequential manufacturing process of a GAA FET device according to one embodiment of the present disclosure. FIG. 5B shows a cross sectional view along line A-A' shown in FIG. 5A.

After the upper portions (stacked layer portions) of the fin structures are exposed, sacrificial gate structures 40 are formed over the exposed fin structures, as shown in FIGS. 5A and 5B. The sacrificial gate structures 40 are formed by first blanket depositing a sacrificial gate dielectric layer 42 over the fin structures. The sacrificial gate dielectric layer 42 includes one or more layers of silicon oxide, silicon nitride or silicon oxynitride. The thickness of the sacrificial gate dielectric layer 42 is in a range from about 1 nm to about 5 nm in some embodiments. A sacrificial gate electrode layer 44 is then blanket deposited on the sacrificial gate dielectric layer 42 and over the fin structures, such that the fin structures are fully embedded in the sacrificial gate electrode layer 44. The sacrificial gate electrode layer 44 includes silicon such as poly crystalline silicon or amorphous silicon. The thickness of the sacrificial gate electrode layer 44 is in a range from about 100 nm to about 200 nm in some embodiments. In some embodiments, the sacrificial gate electrode layer 44 is subjected to a planarization operation. The sacrificial gate dielectric layer and the sacrificial gate electrode layer are deposited using CVD, including LPCVD and PECVD, PVD, ALD, or other suitable process. Subsequently, a mask layer 46 is formed over the sacrificial gate electrode layer 44. The mask layer 46 includes a pad SiN layer and a silicon oxide mask layer in some embodiments.

As shown in FIGS. 5A and 5B, a patterning operation is performed on the mask layer 46, and the sacrificial gate electrode layer 44 is patterned into the sacrificial gate structures 40. FIG. 5B shows a cross sectional view cutting the sacrificial gate structure 40. The sacrificial gate structures 40 are formed over a portion of the fin structure which is to be a channel region. The sacrificial gate structures 40 define the channel region of the GAA FET. Further, by patterning the sacrificial gate structure, the stacked layers of the first and second semiconductor layers are partially exposed on opposite sides of the sacrificial gate structures 40, as source/drain (S/D) regions.

In some embodiment shown in FIG. 5A, one sacrificial gate structure is formed over the two fin structures Fp and two fin structures Fn. However, the configuration of the sacrificial gate structures 40 is not limited to that of FIG. 5A. The width of the sacrificial gate electrode layer 44 is in a range from about 5 nm to about 25 nm in some embodiments.

Figure 6:
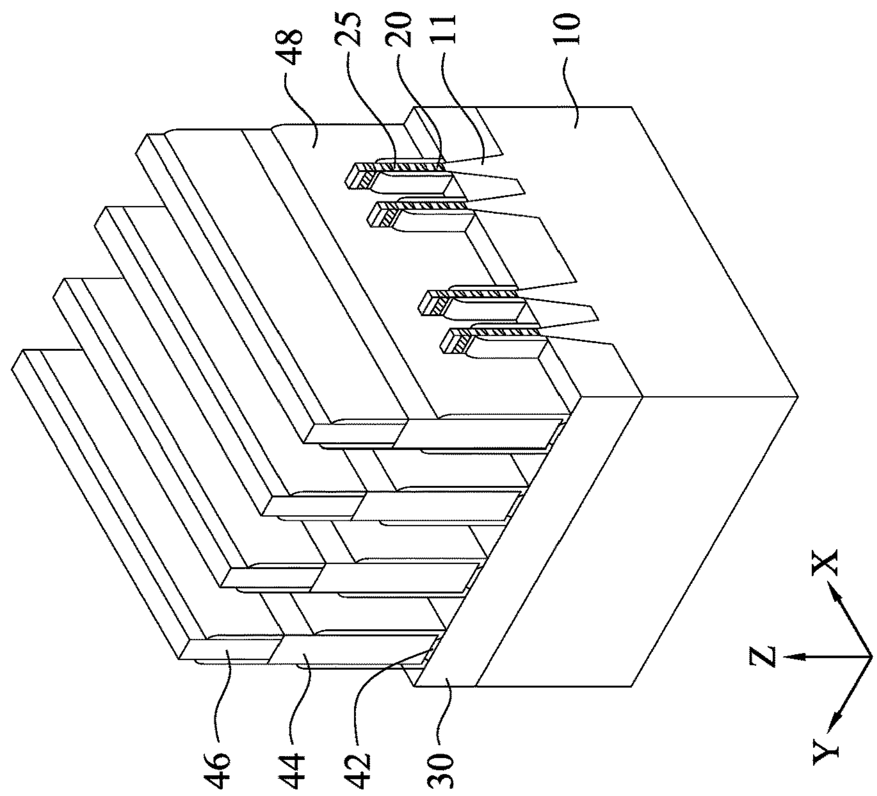
FIG. 6 shows one of the various stages of sequential manufacturing process of a GAA FET device according to embodiments of the present disclosure.

FIG. 6 shows one of various stages of sequential manufacturing process of a GAA FET device according to one embodiment of the present disclosure. As shown in FIG. 6, after the sacrificial gate structures 40 are formed, a blanket layer of an insulating material for sidewall spacers 48 is conformally formed by using CVD or other suitable methods. The blanket layer is deposited in a conformal manner so that it is formed to have substantially equal thicknesses on vertical surfaces, such as the sidewalls, horizontal surfaces, and the top of the sacrificial gate structure. In some embodiments, the blanket layer is deposited to a thickness in a range from about 2 nm to about 10 nm. In one embodiment, the insulating material of the blanket layer is a silicon nitride-based material, such as SiN, SiON, SiOCN or SiCN and combinations thereof.

Then, as shown in FIG. 6, side wall spacers 48 are formed on opposite sidewalls of the sacrificial gate structures 40 and source/drain regions of the fin structures. After the blanket layer is formed, anisotropic etching is performed on the blanket layer using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 46 may be exposed from the sidewall spacers. In some embodiments, isotropic etching is subsequently performed to remove the insulating material from the sidewalls of the exposed fin structures, as shown in FIG. 6. In other embodiments, the insulating material on the sidewalls of the fin structures is partially removed. In some embodiments, the isotropic etch is a wet etch process.

Figure 7:
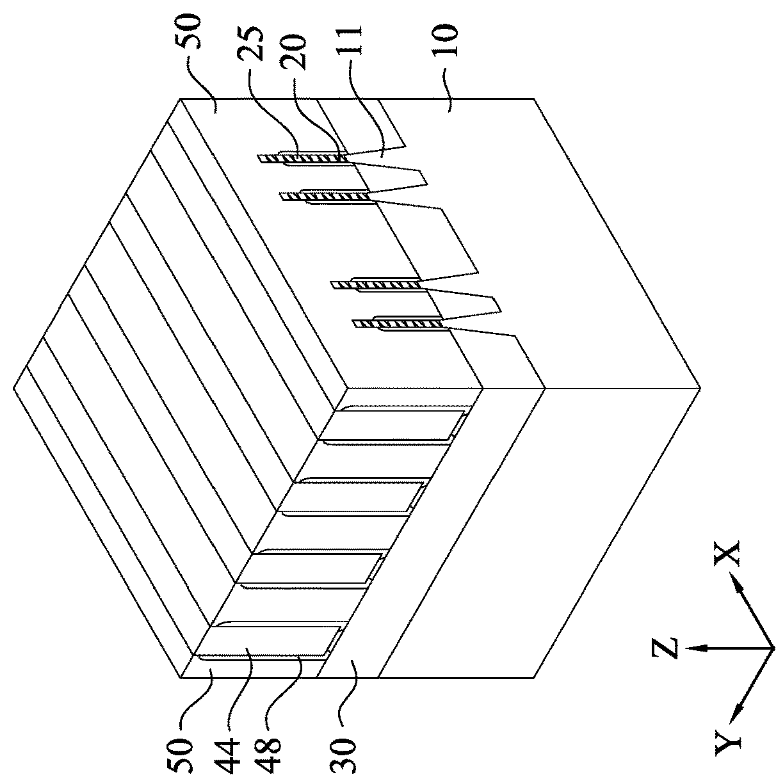
FIG. 7 shows one of the various stages of sequential manufacturing process of a GAA FET device according to embodiments of the present disclosure.

FIG. 7 shows one of various stages of a sequential manufacturing process of a GAA FET device according to embodiments of the present disclosure. In some embodiments, one or more dielectric material layers are formed for a first interlayer dielectric (ILD) layer 50. The materials for the first ILD layer 50 may include compounds comprising Si, O, C and/or H, such as SiCOH and SiOC. Organic material, such as polymers, may be used for the first ILD layer 50. Further, in some embodiments, before forming the first ILD layer 50, a silicon oxide layer is formed over the GAA FET device, and further a SiN layer may be formed over the oxide layer. A SiN layer may also be formed over the first ILD layer 50 to protect the first ILD layer from being etched during subsequent etching of sacrificial gate dielectric layer. After the one or more layers of dielectric material layers are formed, a planarization operation, such as a CMP operation, is performed to expose the sacrificial gate electrode 44, as shown in FIG. 7.

Figure 8B:
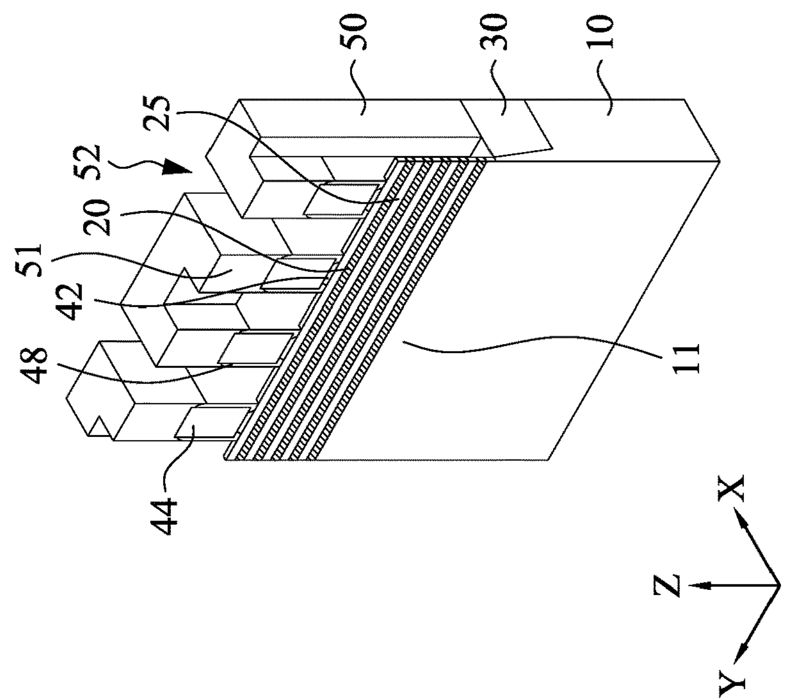
FIGS. 8A and 8B show one of the various stages of sequential manufacturing process of a GAA FET device according to embodiments of the present disclosure.
Figure 8A:
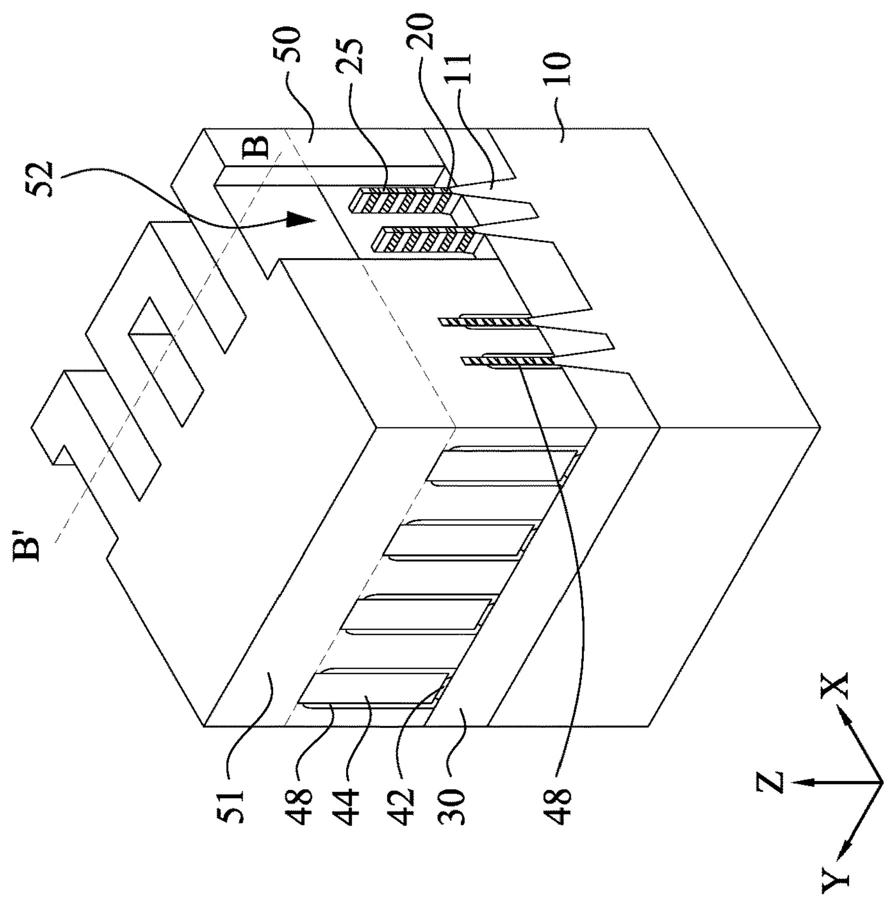

FIGS. 8A and 8B show one of the various stages of sequential manufacturing process of a GAA FET device according to embodiments of the present disclosure. FIG. 8B shows a cross sectional view along line B-B' shown in FIG. 8A. In some embodiments, after the CMP operation, a second ILD layer 51 is formed over the first ILD layer 50. In some embodiments, a dielectric material for the second ILD layer 51 is the same as that of the first ILD layer 50. In other embodiments, a dielectric material for the second ILD layer 51 is different from that of the first ILD layer 50.

Further, as shown in FIGS. 8A and 8B, one or more contact holes 52 for source/drain contacts for a pFET are formed by one or more lithography and etching operations. In the contact holes 52, the source/drain regions of the fin structure Fp are exposed.

Figure 9B:
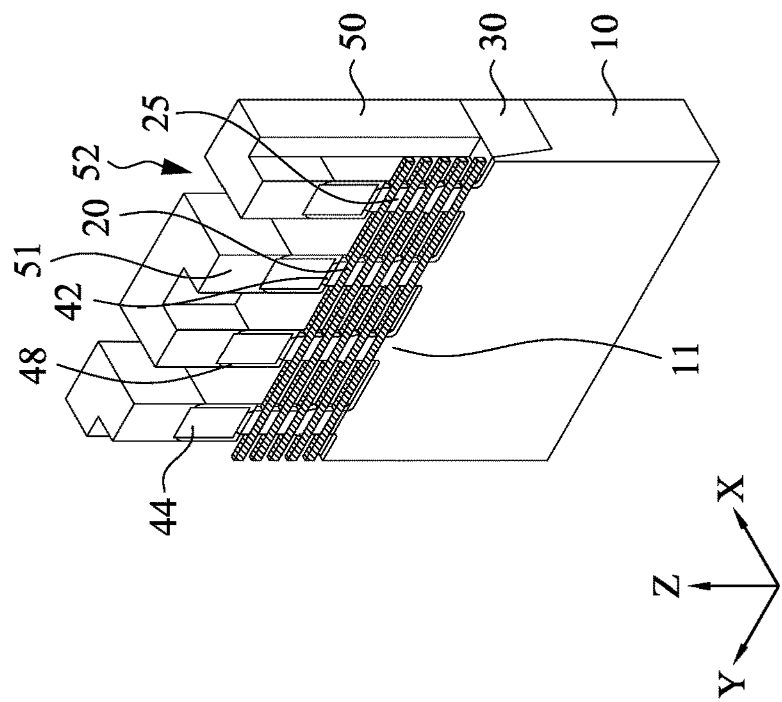
FIGS. 9A and 9B show one of the various stages of sequential manufacturing process of a GAA FET device according to embodiments of the present disclosure.
Figure 9A:
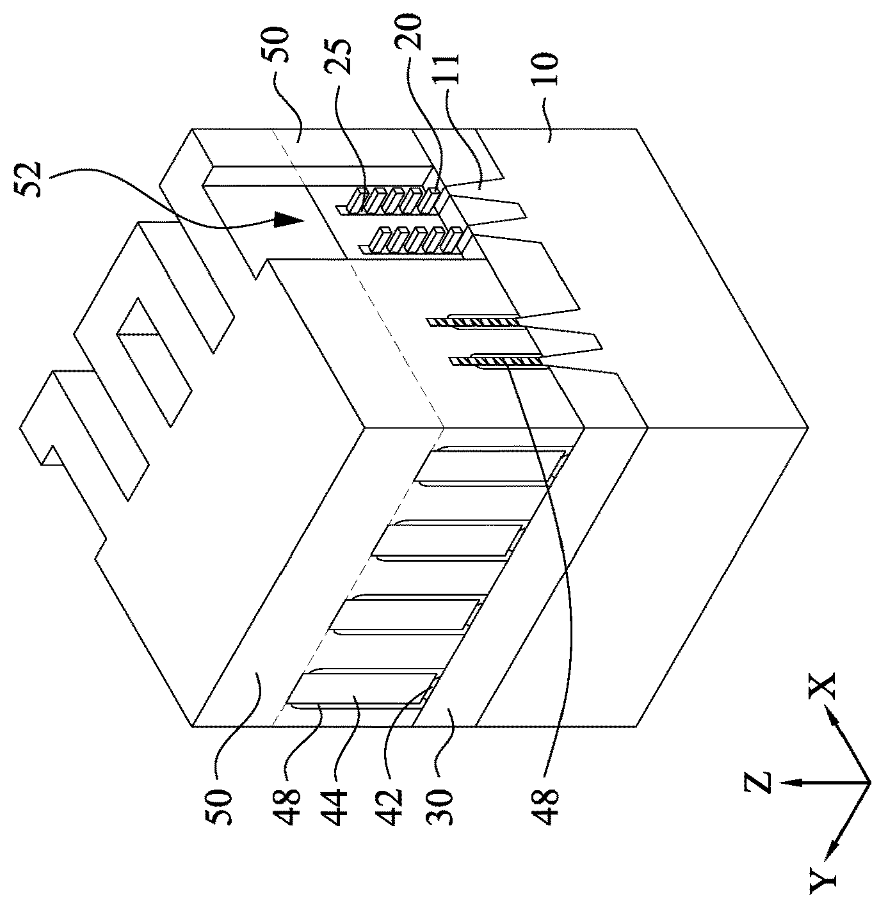

FIGS. 9A and 9B show one of the various stages of sequential manufacturing process of a GAA FET device according to embodiments of the present disclosure. FIG. 9B shows a cross sectional view along line B-B' shown in FIG. 8A.

After the source/drain regions are exposed, the second semiconductor layer 25 are removed from the source/drain regions. In some embodiments, the second semiconductor layers 25 can be selectively removed using a wet etchant such as, but not limited to ammonium hydroxide ($NH_4OH$), tetramethylammonium hydroxide (TMAH), ethylenediamine pyrocatechol (EDP), a potassium hydroxide (KOH) solution, a hydrochloric acid (HCl) solution, or a hot ammonia solution. A plasma dry etching or a chemical vapor etching may also be used. In some embodiments, the second semiconductor layers 25 are not removed.

Figure 10B:
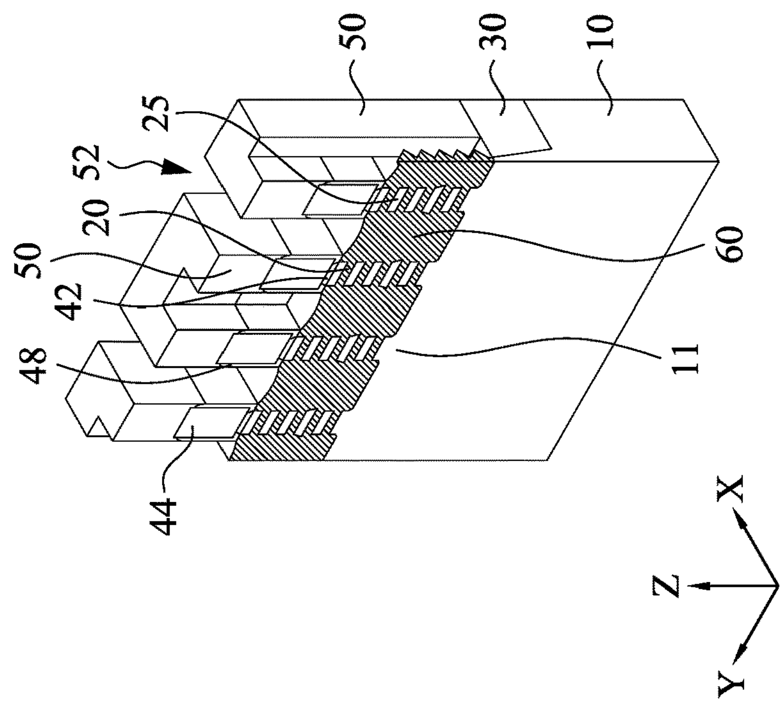
FIGS. 10A and 10B show one of the various stages of sequential manufacturing process of a GAA FET device according to embodiments of the present disclosure.
Figure 10A:
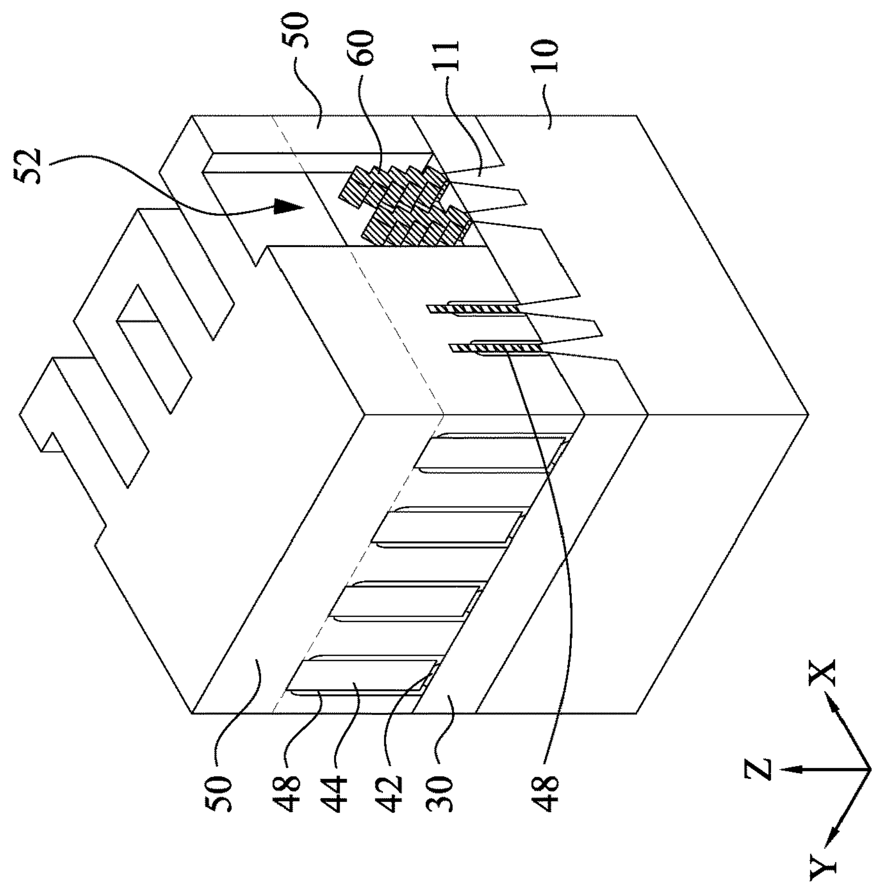

FIGS. 10A and 10B show one of the various stages of sequential manufacturing process of a GAA FET device according to embodiments of the present disclosure. FIG. 10B shows a cross sectional view along line B-B' shown in FIG. 8A.

After the second semiconductor layer 25 are selectively removed in the source/drain regions, a source/drain epitaxial layer 60 is formed around the remaining first semiconductor layers 20. The epitaxial layer 60 includes one or more of Ge and GeSn. The source/drain epitaxial layer 60 is formed by an epitaxial growth method using CVD, ALD or molecular beam epitaxy (MBE). In some embodiments, the source/drain epitaxial layer 60 is doped with, for example, boron (B). In some embodiments, as shown in FIGS. 10A and 10B, the source/drain epitaxial layer 60 is formed on the first semiconductor layer 20 over the fin structures, respectively. In other embodiments, the source/drain epitaxial layer 60 form a merged structure.

Figure 11B:
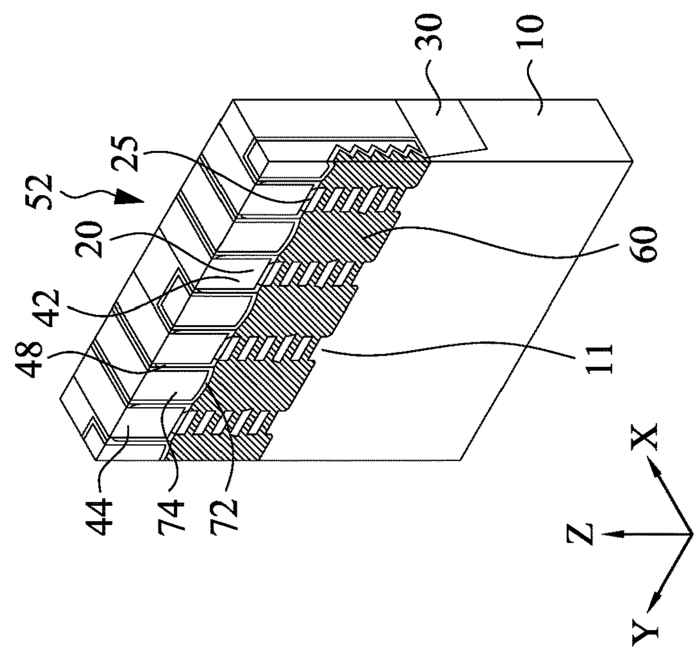
FIGS. 11A and 11B show one of the various stages of sequential manufacturing process of a GAA FET device according to embodiments of the present disclosure.
Figure 11A:
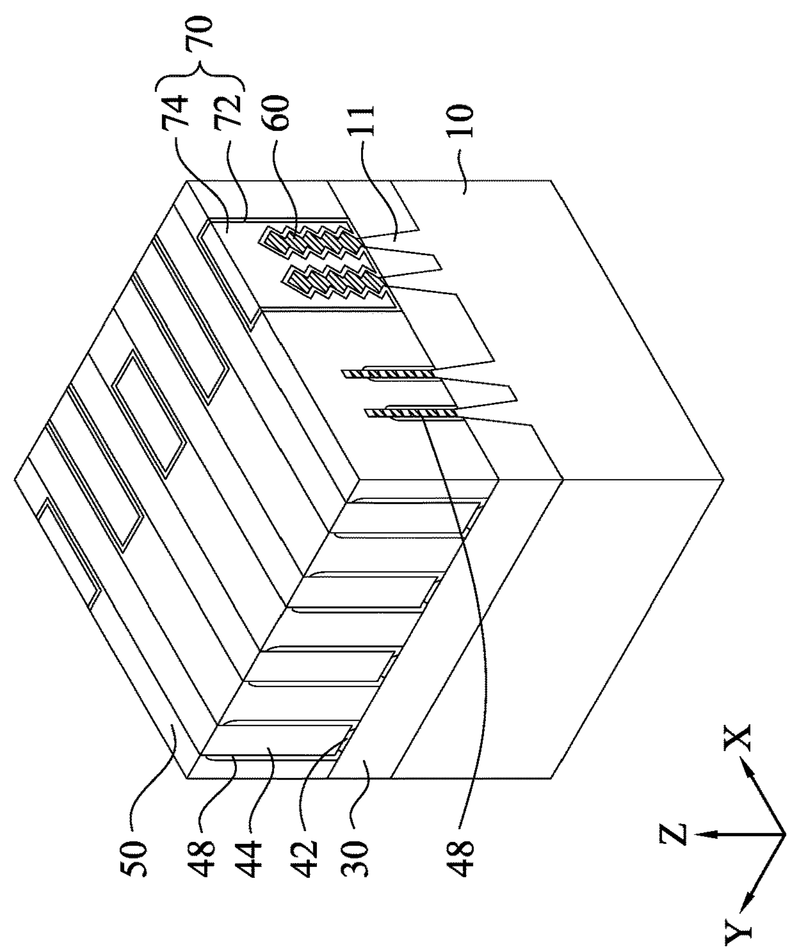

FIGS. 11A and 11B show one of the various stages of sequential manufacturing process of a GAA FET device according to embodiments of the present disclosure. FIG. 11B shows a cross sectional view along line B-B' shown in FIG. 8A.

After the source/drain epitaxial layer 60 is formed, a conductive contact layer 70 is formed over the source/drain epitaxial layer 60. In some embodiments, the conductive contact layer 70 includes a liner or a barrier layer 72 and a body contact layer 74. In some embodiments, the liner or barrier layer 72 includes one or more of Ti, TiN, Ta and TaN. In some embodiments, the body contact layer 74 includes one or more of W, Co, Ni, Mo, Cu and alloy thereof. After the conductive material layers for the conductive contact layer 70 are formed, a CMP operation is performed to remove excess materials disposed over the second ILD layer 52. The conductive materials may be formed from CVD, ALD, sputtering, electro-plating, or other suitable method. In some embodiments, a silicide layer is formed on the source/drain epitaxial layer 60 before forming the conductive contact layer 70.

Figure 12B:
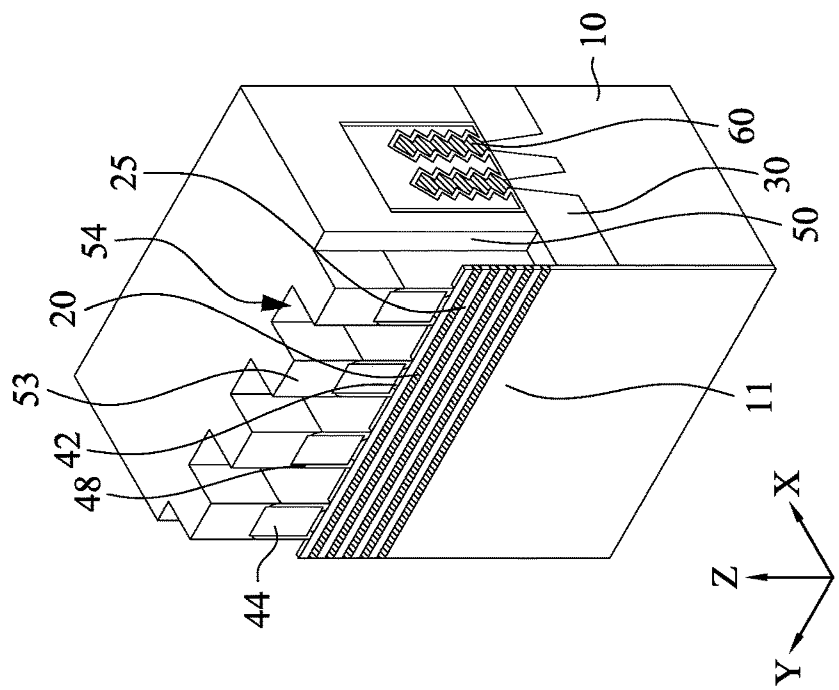
FIGS. 12A and 12B show one of the various stages of sequential manufacturing process of a GAA FET device according to embodiments of the present disclosure.
Figure 12A:
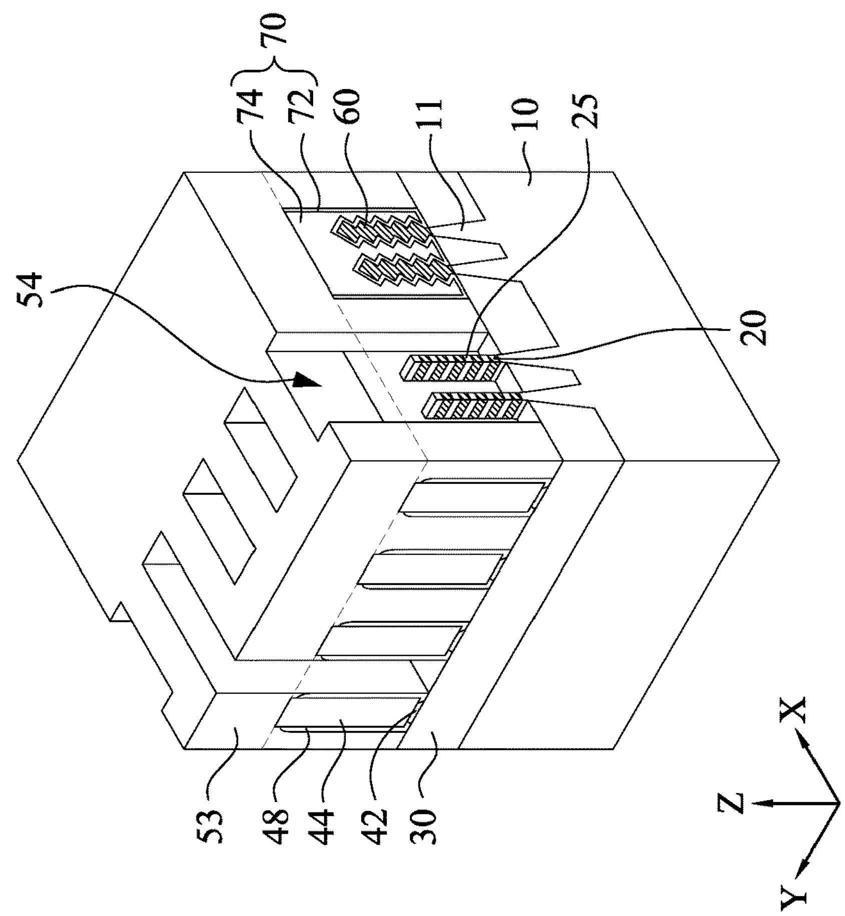

FIGS. 12A and 12B show one of the various stages of sequential manufacturing process of a GAA FET device according to embodiments of the present disclosure. FIG. 12B shows a cross sectional view along line B-B' shown in FIG. 8A. In some embodiments, after the conductive contact layer 70 is formed, a third ILD layer 53 is formed as shown in FIGS. 12A and 12B. In some embodiments, a dielectric material for the third ILD layer 53 is the same as that of the first ILD layer 50. In other embodiments, a dielectric material for the third ILD layer 53 is different from that of the first ILD layer 50.

Further, as shown in FIGS. 12A and 12B, one or more contact holes 54 for source/drain contacts for an nFET are formed by one or more lithography and etching operations. In the contact holes 54, the source/drain regions of the fin structure Fn are exposed.

Figure 13B:
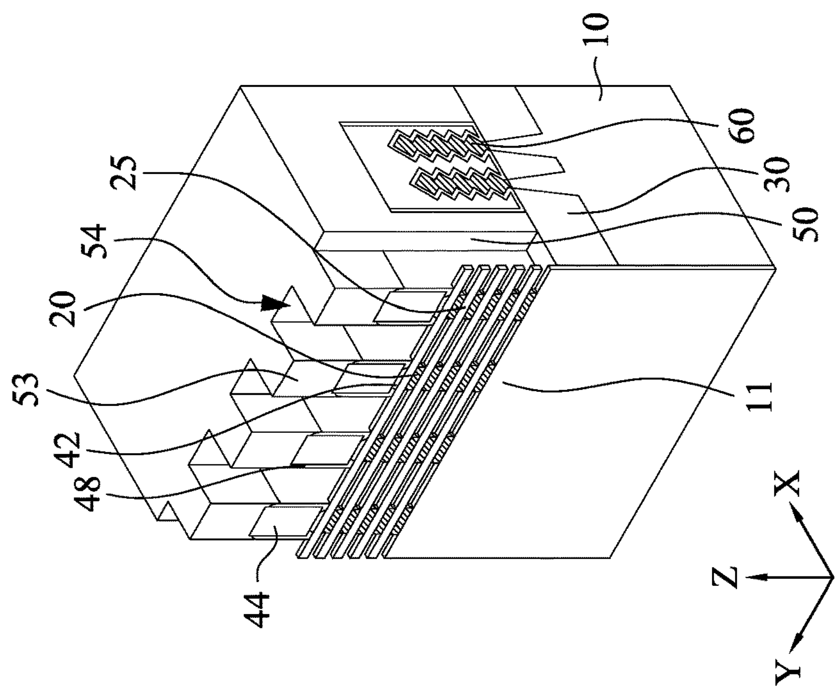
FIGS. 13A and 13B show one of the various stages of sequential manufacturing process of a GAA FET device according to embodiments of the present disclosure.
Figure 13A:
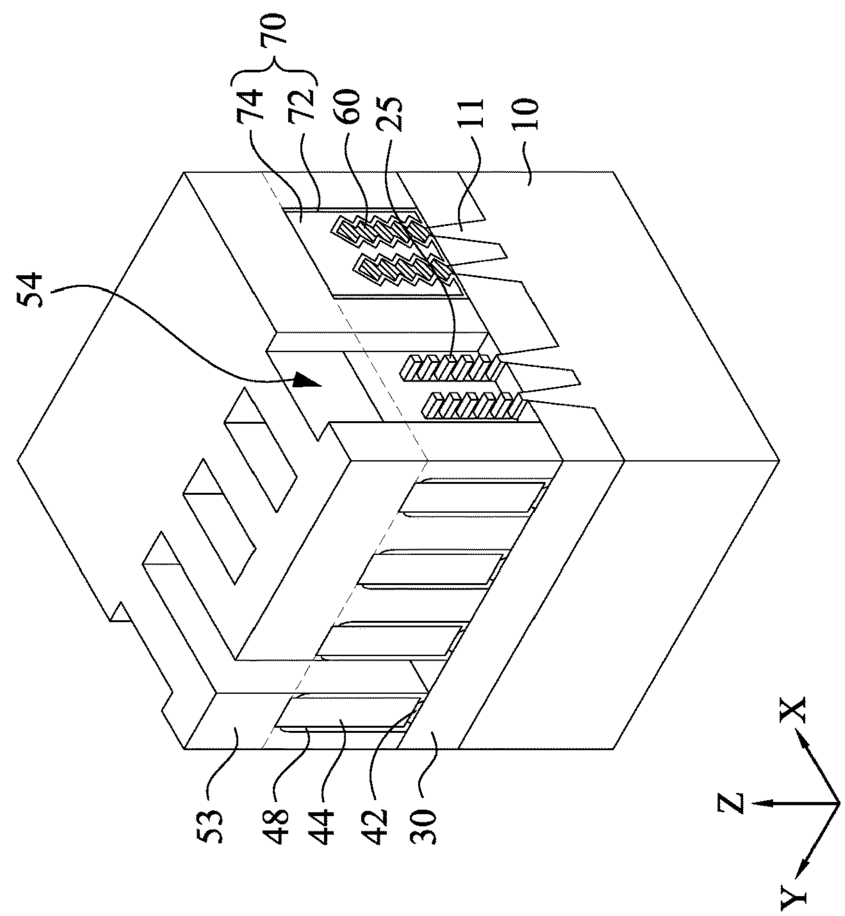

FIGS. 13A and 13B show one of the various stages of sequential manufacturing process of a GAA FET device according to embodiments of the present disclosure. FIG. 13B shows a cross sectional view along line B-B' shown in FIG. 8A.

After the source/drain regions are exposed, the first semiconductor layer 20 are removed from the source/drain regions. In some embodiments, the first semiconductor layers 20 can be selectively removed using a wet etchant such as, but not limited to ammonium hydroxide ($NH_4OH$), tetramethylammonium hydroxide (TMAH), ethylenediamine pyrocatechol (EDP), a potassium hydroxide (KOH) solution, a hydrochloric acid (HCl) solution, or a hot ammonia solution. A plasma dry etching or a chemical vapor etching may also be used.

Figure 14B:
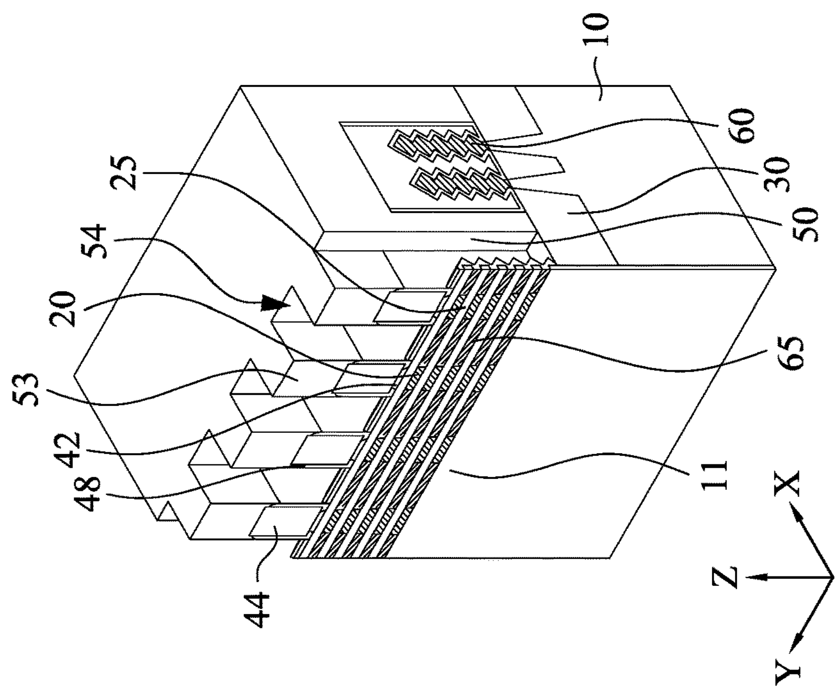
FIGS. 14A and 14B show one of the various stages of sequential manufacturing process of a GAA FET device according to embodiments of the present disclosure.
Figure 14A:
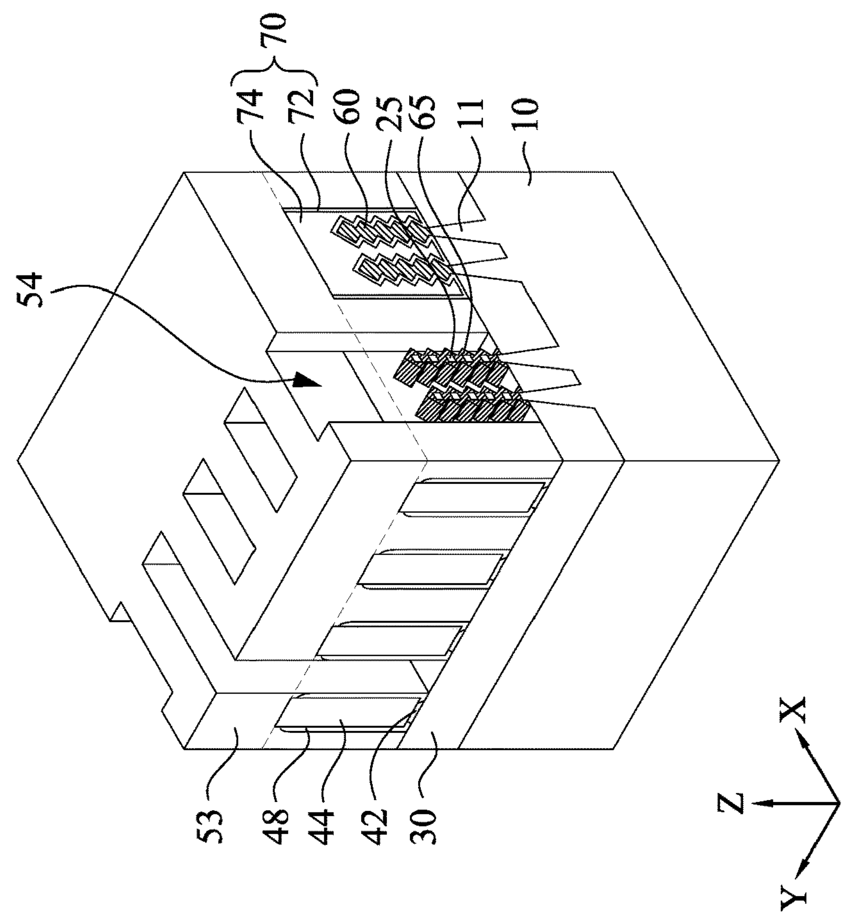

FIGS. 14A and 14B show one of the various stages of sequential manufacturing process of a GAA FET device according to embodiments of the present disclosure. FIG. 14B shows a cross sectional view along line B-B' shown in FIG. 8A.

After the first semiconductor layer 20 are selectively removed in the source/drain regions, a source/drain epitaxial layer 65 is formed around the remaining second semiconductor layers 25. The epitaxial layer 65 includes one or more of Si and SiGe having a lower Ge concentration than the second semiconductor layers 25. In some embodiments, when the second semiconductor layers 25 are $Si_{1-z}Ge_z$, where z is in a range from about 0.4 to about 0.7, the source/drain epitaxial layer 65 is made of $Si_{1-w}Ge_w$, where w is smaller than z and is in a range from about 0 to about 0.3. In some embodiments, the source/drain epitaxial layer 65 is made of Si. In other embodiments, the source/drain epitaxial layer 65 is made of SiC.

The source/drain epitaxial layer 65 is formed by an epitaxial growth method using CVD, ALD or molecular beam epitaxy (MBE). In some embodiments, the source/drain epitaxial layer 65 is doped with, for example, phosphorous (P) and/or arsenic (As). In some embodiments, as shown in FIGS. 14A and 14B, the source/drain epitaxial layer 65 is formed on the second semiconductor layer 25 over the fin structures, respectively. In other embodiments, the source/drain epitaxial layer 65 form a merged structure.

Figure 15B:
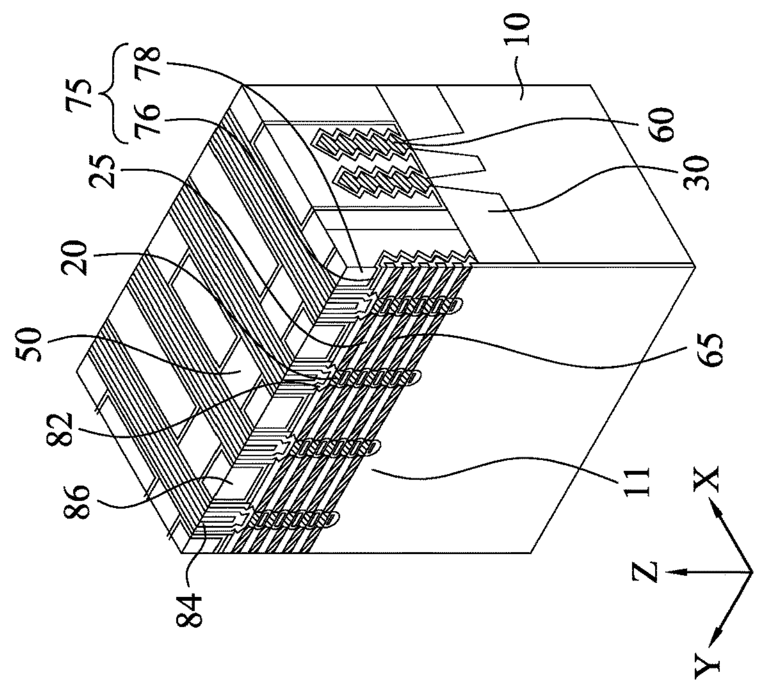
FIGS. 15A, 15B and 15C show one of the various stages of sequential manufacturing process of a GAA FET device according to embodiments of the present disclosure.
Figure 15A:
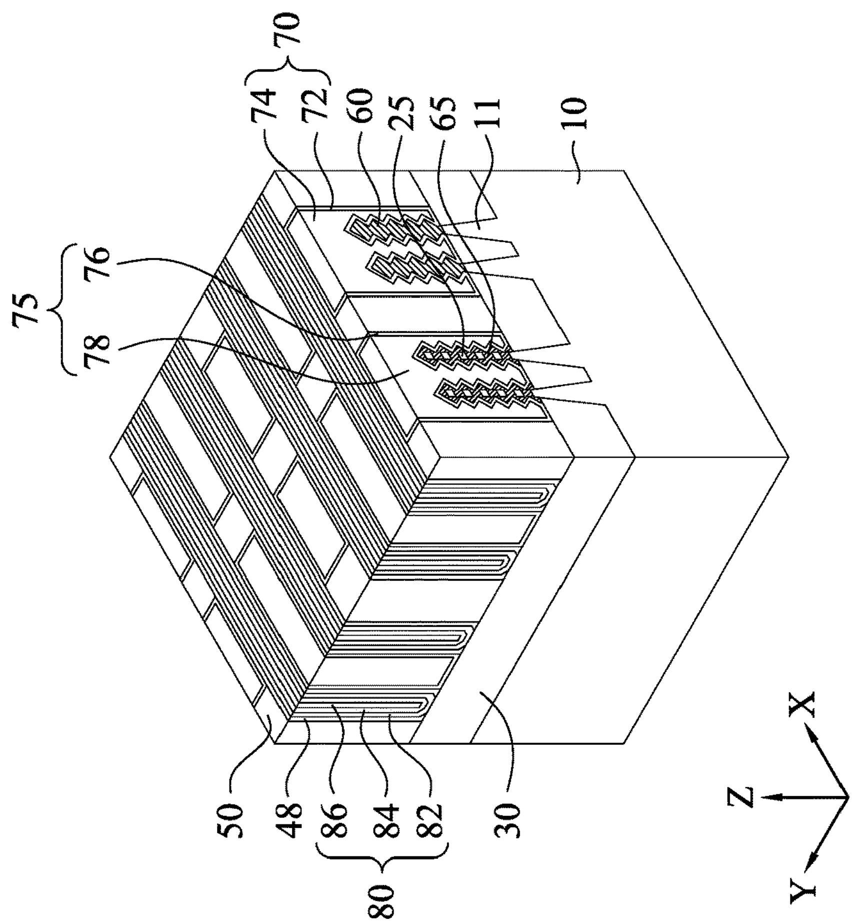
Figure 15C:
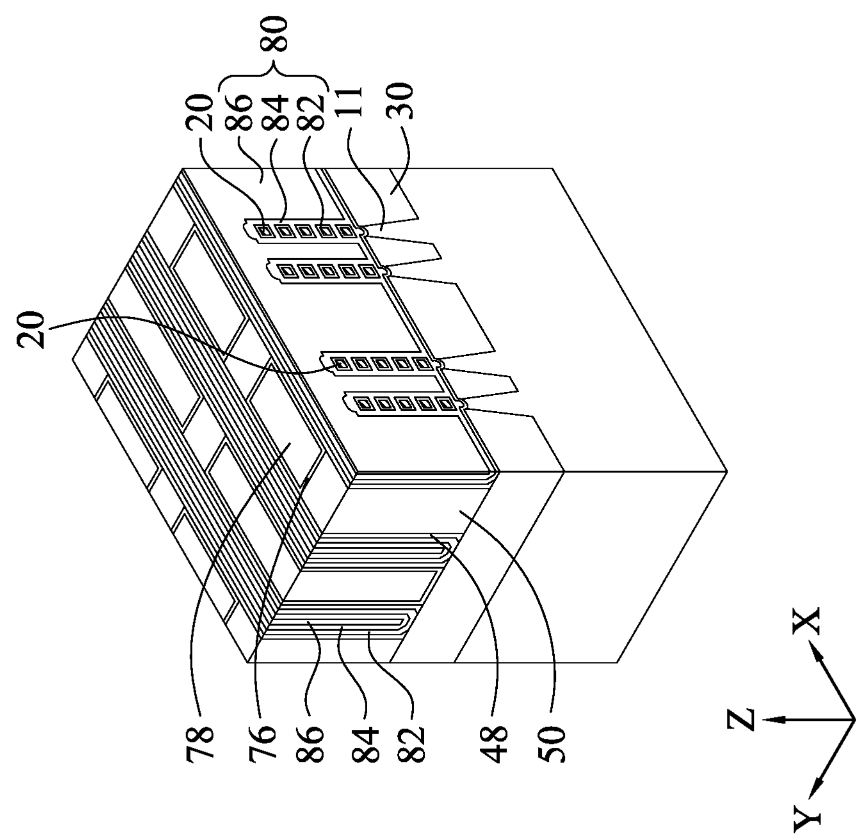

FIGS. 15A, 15B and 15C show one of the various stages of sequential manufacturing process of a GAA FET device according to embodiments of the present disclosure. FIG. 15B shows a cross sectional view along line B-B' shown in FIG. 8A and FIG. 15C shows a cross sectional view along line A-A' shown in FIG. 5A.

After the source/drain epitaxial layer 65 is formed, a conductive contact layer 75 is formed over the source/drain epitaxial layer 65. In some embodiments, the conductive contact layer 75 includes a liner or a barrier layer 76 and a body contact layer 78. In some embodiments, the liner or barrier layer 76 includes one or more of Ti, TiN, Ta and TaN. In some embodiments, the body contact layer 78 includes one or more of W, Co, Ni, Mo, Cu and alloy thereof. After the conductive material layers for the conductive contact layer 75 are formed, a CMP operation is performed to remove excess materials disposed over the third ILD layer 54. The conductive materials may be formed from CVD, ALD, sputtering, electro-plating, or other suitable method. In some embodiments, a silicide layer is formed on the source/drain epitaxial layer 65 before forming the conductive contact layer 75.

Further, the sacrificial gate structures 40 are replaced with metal gate structures 80. The sacrificial gate electrodes 44 and the sacrificial gate dielectric layers 42 are removed, thereby exposing the fin structures Fp and Fn, which subsequently become channel regions of the GAA FETs. When the sacrificial gate electrode 44 is polysilicon, a wet etchant such as a TMAH solution can be used to selectively remove the sacrificial gate electrodes 44. The sacrificial gate dielectric layer 42 is thereafter removed using plasma dry etching and/or wet etching.

Then, the second semiconductor layers 25 are removed from the channel regions by using, for example, a wet etching operation. In some embodiments, the second semiconductor layers 25 can be selectively removed using a wet etchant such as, but not limited to ammonium hydroxide ($NH_4OH$), tetramethylammonium hydroxide (TMAH), ethylenediamine pyrocatechol (EDP), a potassium hydroxide (KOH) solution, a hydrochloric acid (HCl) solution, or a hot ammonia solution. A plasma dry etching or a chemical vapor etching may also be used.

In some embodiments, in the pFET, the source/drain epitaxial layer 60 is formed of Ge (or GeSn), and the second semiconductor layers 25 are formed of SiGe. Accordingly, the etching of the second semiconductor layers 25 stops at the source/drain epitaxial layer 60. In the nFET, the source/drain epitaxial layer 65 is formed of Si (or SiC), and the etching of the second semiconductor layers 25 stops at the source/drain epitaxial layer 65. This structure can prevent the gate electrode from contacting the source/drain epitaxial layers.

After the nanowires of the first semiconductor layers 20 are released in the channel regions, metal gate structures 80 are formed. The metal gate structures 80 includes a high-k gate dielectric layer 82, one or more layers of work function adjustment material 84 and a body gate electrode layer 86 in some embodiments. In some embodiments, an interfacial layer including a silicon oxide layer is formed before the gate dielectric layer 82 is formed. In some embodiments, the gate dielectric layer 82 includes one or more layers of a dielectric material, such as, silicon nitride, $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate dielectric layer 82 may be formed from CVD, ALD or any suitable method. In one embodiment, the gate dielectric layer is formed using a highly conformal deposition process such as ALD in order to ensure the formation of a gate dielectric layer having a uniform thickness around each channel layers. The thickness of the gate dielectric layer 82 is in a range from about 1 nm to about 6 nm in one embodiment.

In some embodiments, one or more work function adjustment layers 84 are formed on the gate dielectric layer 82. The work function adjustment layers 84 are made of a conductive material such as a single layer of TiN, TaN, TaAlC, TiC, TaC, Co, Al, TiAl, HfTi, TiSi, TaSi or TiAlC, or a multilayer of two or more of these materials. For the nFET, one or more of TaN, TaAlC, TiN, TiC, Co, TiAl, HfTi, TiSi and TaSi is used as the work function adjustment layer, and for the pFET, one or more of TiAlC, Al, TiAl, TaN, TaAlC, TiN, TiC and Co is used as the work function adjustment layer. The work function adjustment layer 84 may be formed by ALD, PVD, CVD, e-beam evaporation, or other suitable process. Further, the work function adjustment layer 84 may be formed separately for the nFET and the pFET which may use different metal layers.

The body gate electrode layer 86 is formed to surround each channel regions (nanowires). The body gate electrode layer 86 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The body gate electrode layer 86 may be formed from CVD, ALD, electro-plating, or other suitable method. The body gate electrode layer 86 is also deposited over the upper surface of the ILD layer. The materials for the metal gate structures 80 over the ILD layer are then planarized by using, for example, CMP, until the top surface of the ILD layer is revealed. It is understood that the GAA FETs undergo further CMOS processes to form various features such as contacts/vias, interconnect metal layers, dielectric layers, passivation layers, etc. As shown in FIGS. 15A-15C, none of the channel regions 20 is in contact with the bottom fin layer 11.

FIGS. 16A-18B show various stages for a sequential manufacturing process of a GAA FET device according to other embodiments of the present disclosure. It is understood that in the sequential manufacturing process, one or more additional operations can be provided before, during, and after the stages shown in FIGS. 16A-18B, and some of the operations described below can be replaced or eliminated for additional embodiments of the method. The order of the operations/processes may be interchangeable. Materials, dimensions, configurations, processes, and/or operations as explained with the foregoing embodiments may be employed in the following embodiments, and detailed explanation thereof may be omitted.

Figure 16B:
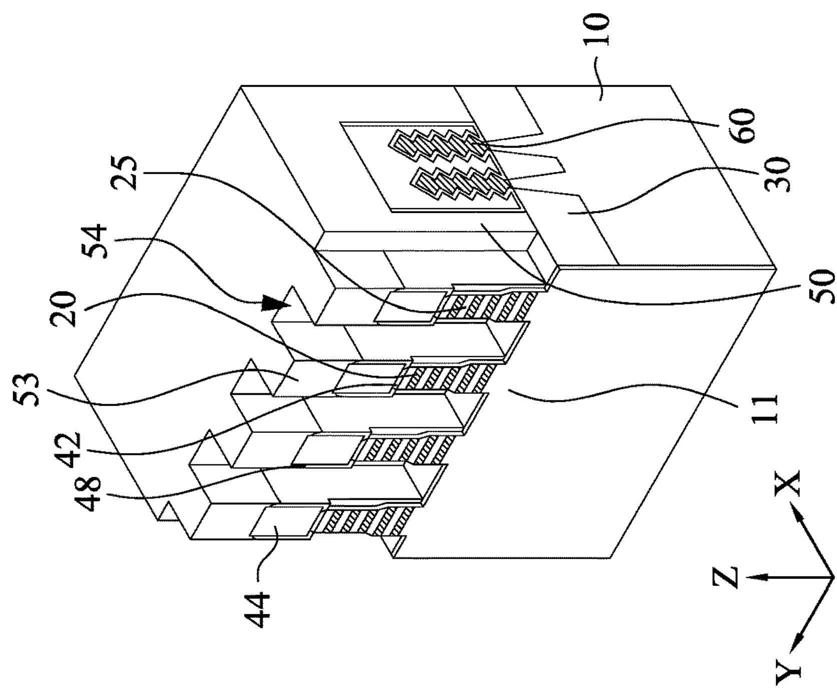
FIGS. 16A and 16B show one of the various stages of sequential manufacturing process of a GAA FET device according to other embodiments of the present disclosure.
Figure 16A:
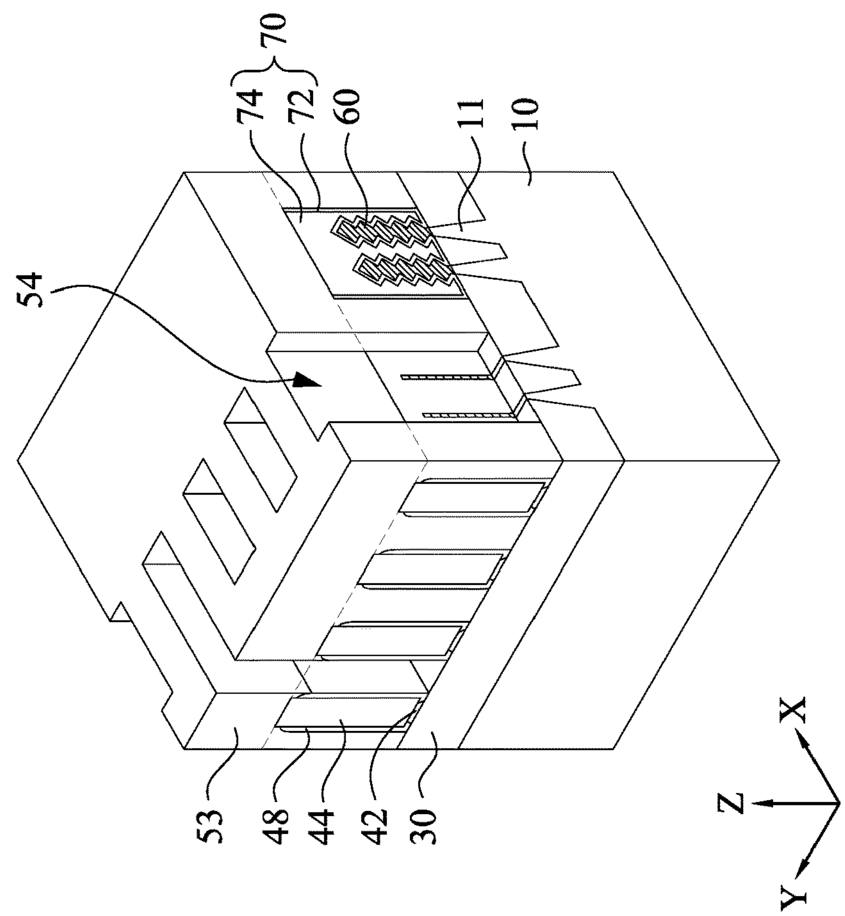

FIGS. 16A and 16B show one of the various stages of sequential manufacturing process of a GAA FET device according to other embodiments of the present disclosure. After the structure shown in FIGS. 12A and 12B is formed, the source/drain regions of the fin structure Fn, which are exposed in the holes 54, are removed by one or more appropriate etching operations. In some embodiments, an upper portion of the bottom fin layer 11 is also removed. In some embodiments, the first and second semiconductor layers 20 and 25 are laterally etched so that ends of the first and second semiconductor layers 20 and 25 are located below the sidewall spacers 48. In other embodiments, the ends of the first and second semiconductor layers 20 and 25 are located below the dummy gate electrode layer 44.

Figure 17B:
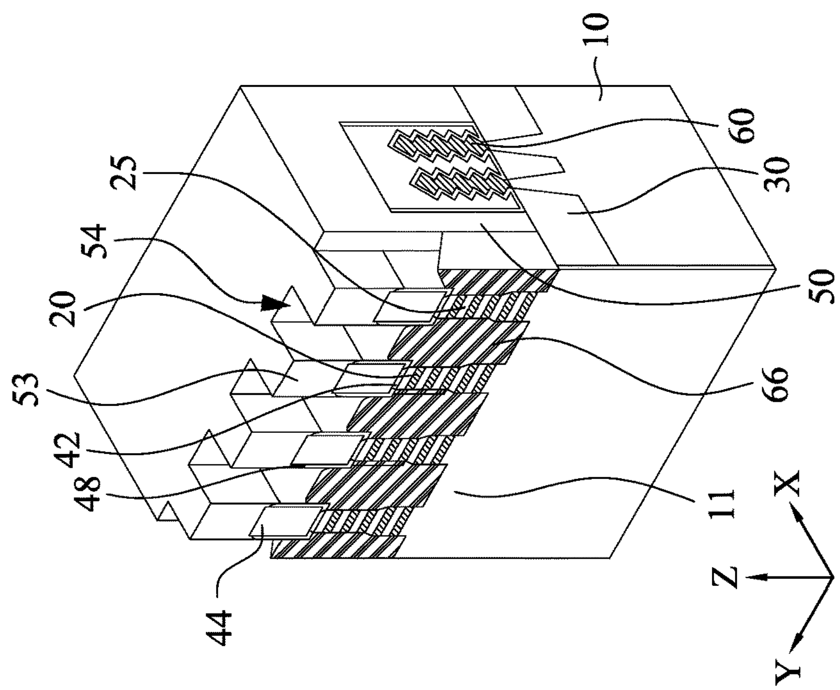
FIGS. 17A and 17B show one of the various stages of sequential manufacturing process of a GAA FET device according to other embodiments of the present disclosure.
Figure 17A:
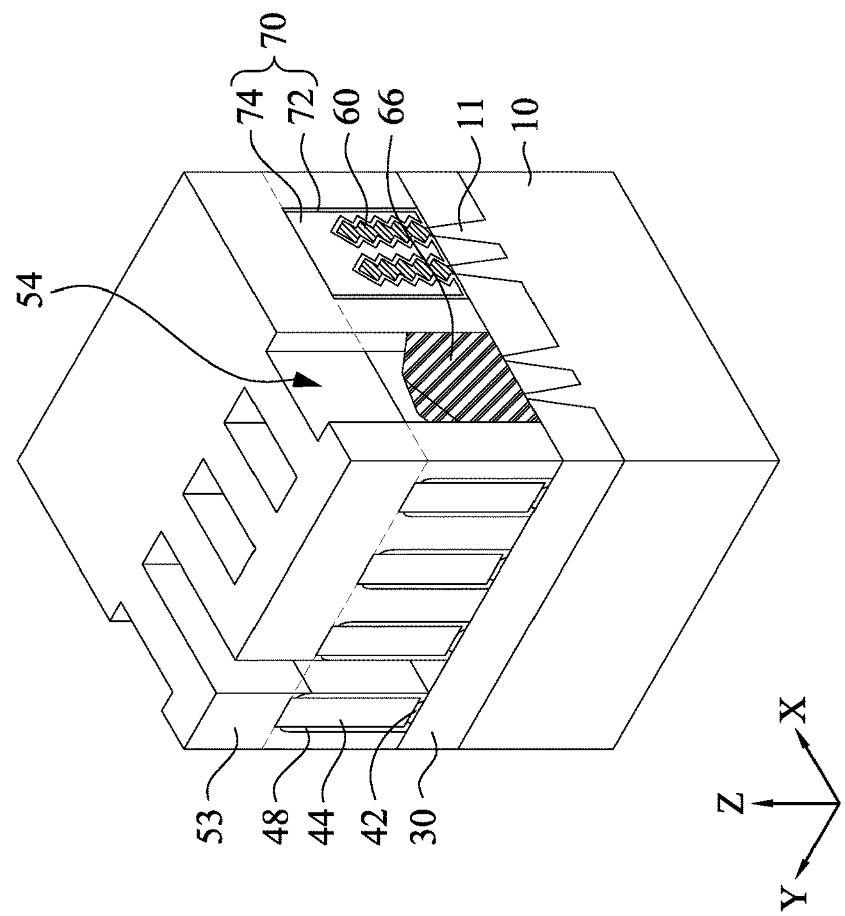

FIGS. 17A and 17B show one of the various stages of sequential manufacturing process of a GAA FET device according to other embodiments of the present disclosure. Then, as shown in FIGS. 17A and 17B, a source/drain epitaxial layer 66 is formed on the ends of the first and second semiconductor layers 20 and 25. The epitaxial layer 66 includes one or more of Si and SiGe having a lower Ge concentration than the second semiconductor layers 25. In some embodiments, when the second semiconductor layers 25 are $Si_{1-z}Ge_z$, where z is in a range from about 0.4 to about 0.7, the source/drain epitaxial layer 66 is made of $Si_{1-w}Ge_w$, where w is smaller than z and is in a range from about 0 to about 0.3. In some embodiments, the source/drain epitaxial layer 66 is made of SiC. In some embodiments, as shown in FIGS. 17A and 17B, the source/drain epitaxial layer 66 is a merged structure shared by two fin structures. The source/drain epitaxial layer 66 can be formed by CVD, MBE or ALD, using silicon precursor, such as $SiH_4$, $Si_2H_4$ and/or $Si_3H_8$.

Figure 18B:
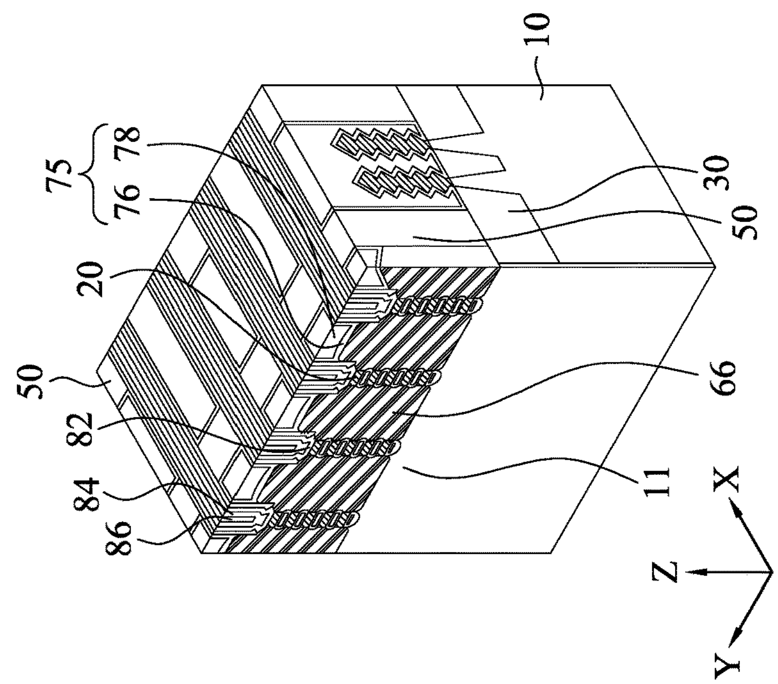
FIGS. 18A and 18B show one of the various stages of sequential manufacturing process of a GAA FET device according to other embodiments of the present disclosure.
Figure 18A:
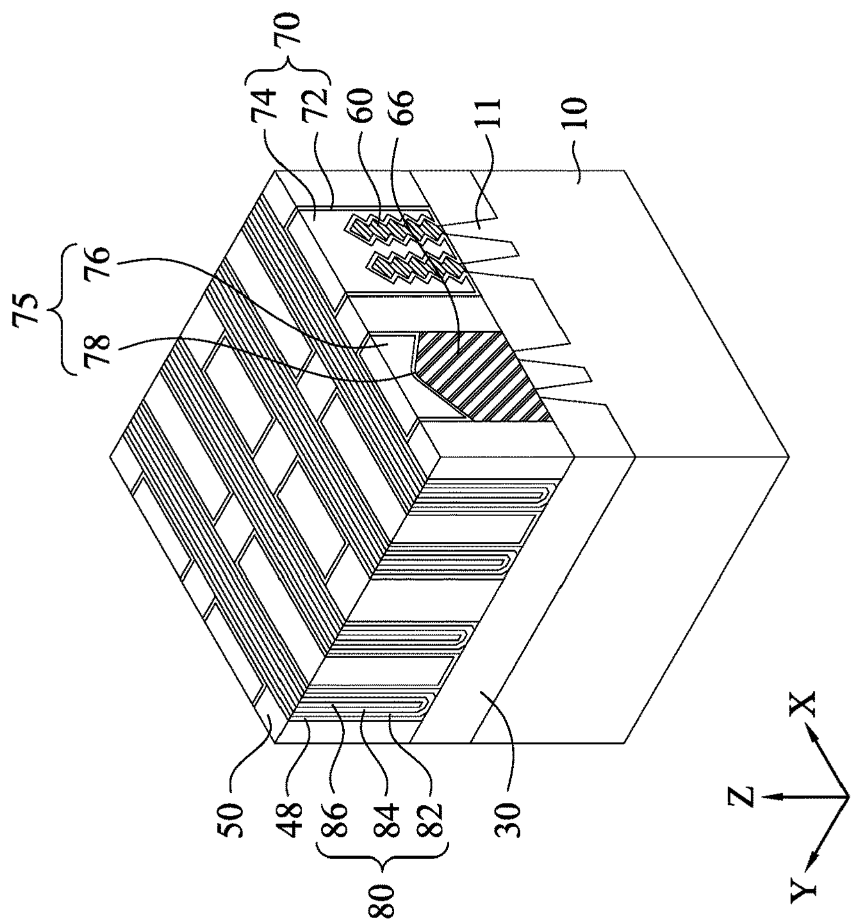

FIGS. 18A and 18B show one of the various stages of sequential manufacturing process of a GAA FET device according to other embodiments of the present disclosure. Subsequently, by operations same as or similar to those explained with respect to FIGS. 15A-15C, a conductive contact layer 75 and a metal gate structure 80 are formed. It is understood that the GAA FETs undergo further CMOS processes to form various features such as contacts/vias, interconnect metal layers, dielectric layers, passivation layers, etc.

FIGS. 19A-20B show various stages for a sequential manufacturing process of a GAA FET device according to other embodiments of the present disclosure. It is understood that in the sequential manufacturing process, one or more additional operations can be provided before, during, and after the stages shown in FIGS. 19A-20B, and some of the operations described below can be replaced or eliminated for additional embodiments of the method. The order of the operations/processes may be interchangeable. Materials, dimensions, configurations, processes, and/or operations as explained with the foregoing embodiments may be employed in the following embodiments, and detailed explanation thereof may be omitted.

Figure 19B:
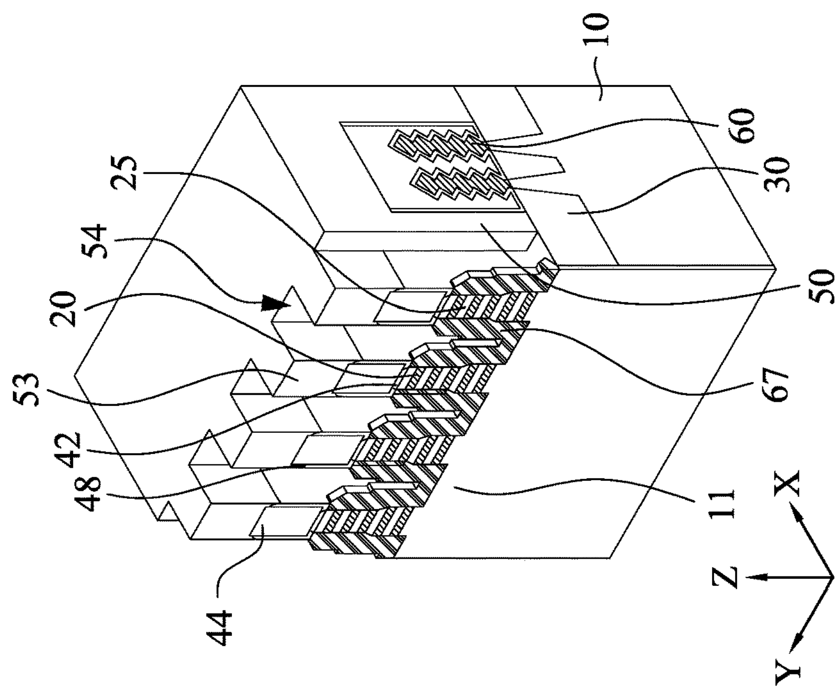
FIGS. 19A and 19B show one of the various stages of sequential manufacturing process of a GAA FET device according to other embodiments of the present disclosure.
Figure 19A:
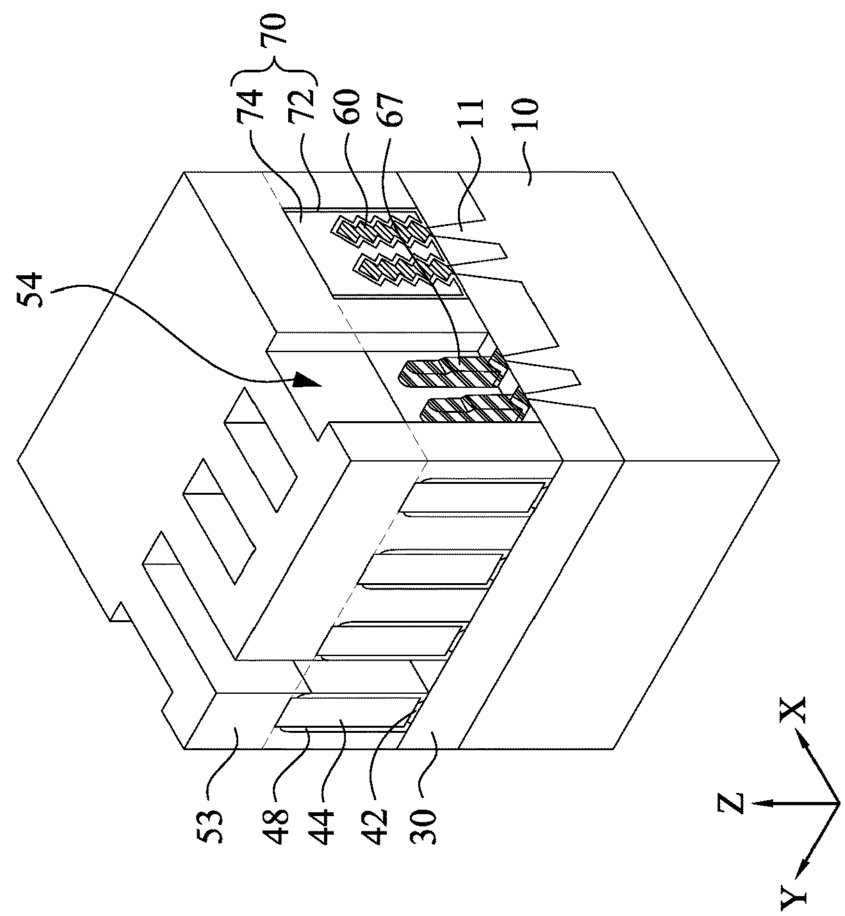

FIGS. 19A and 19B show one of the various stages of sequential manufacturing process of a GAA FET device according to other embodiments of the present disclosure. After the structure shown in FIGS. 16A and 16B is formed, a source/drain epitaxial layer 67 is formed on the ends of the first and second semiconductor layers 20 and 25. The epitaxial layer 67 includes one or more of Si and SiGe having a lower Ge concentration than the second semiconductor layers 25. In some embodiments, when the second semiconductor layers 25 are $Si_{1-z}Ge_z$, where z is in a range from about 0.4 to about 0.7, the source/drain epitaxial layer 67 is made of $Si_{1-w}Ge_w$, where w is smaller than z and is in a range from about 0 to about 0.3. In some embodiments, the source/drain epitaxial layer 66 is made of SiC. In some embodiments, as shown in FIGS. 19A and 19B, the source/drain epitaxial layer 67 is formed for respective fin structures, and separated from each other. The source/drain epitaxial layer 67 can be formed by CVD, MBE or ALD, using silicon precursor, such as $SiH_4$, $Si_2H_4$ and/or $Si_3H_8$ together with HCl in some embodiments.

Figure 20B:
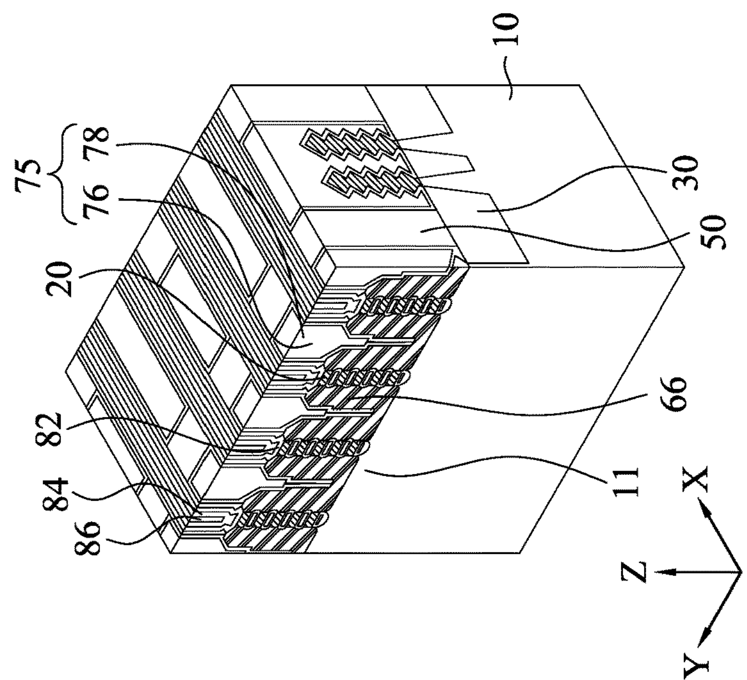
FIGS. 20A and 20B show one of the various stages of sequential manufacturing process of a GAA FET device according to other embodiments of the present disclosure.
Figure 20A:
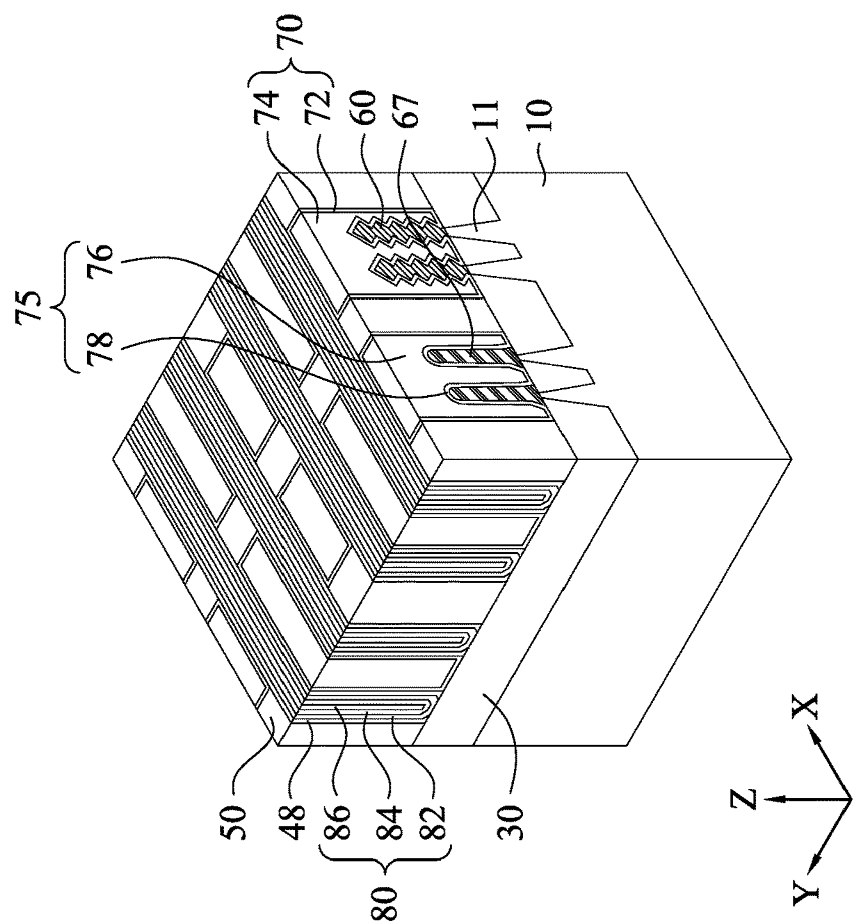

FIGS. 20A and 20B show one of the various stages of sequential manufacturing process of a GAA FET device according to other embodiments of the present disclosure. Subsequently, by operations same as or similar to those explained with respect to FIGS. 15A-15C, a conductive contact layer 75 and a metal gate structure 80 are formed. It is understood that the GAA FETs undergo further CMOS processes to form various features such as contacts/vias, interconnect metal layers, dielectric layers, passivation layers, etc.

FIGS. 21A-23B show various stages for a sequential manufacturing process of a GAA FET device according to other embodiments of the present disclosure. It is understood that in the sequential manufacturing process, one or more additional operations can be provided before, during, and after the stages shown in FIGS. 21A-23B, and some of the operations described below can be replaced or eliminated for additional embodiments of the method. The order of the operations/processes may be interchangeable. Materials, dimensions, configurations, processes, and/or operations as explained with the foregoing embodiments may be employed in the following embodiments, and detailed explanation thereof may be omitted.

Figure 21B:
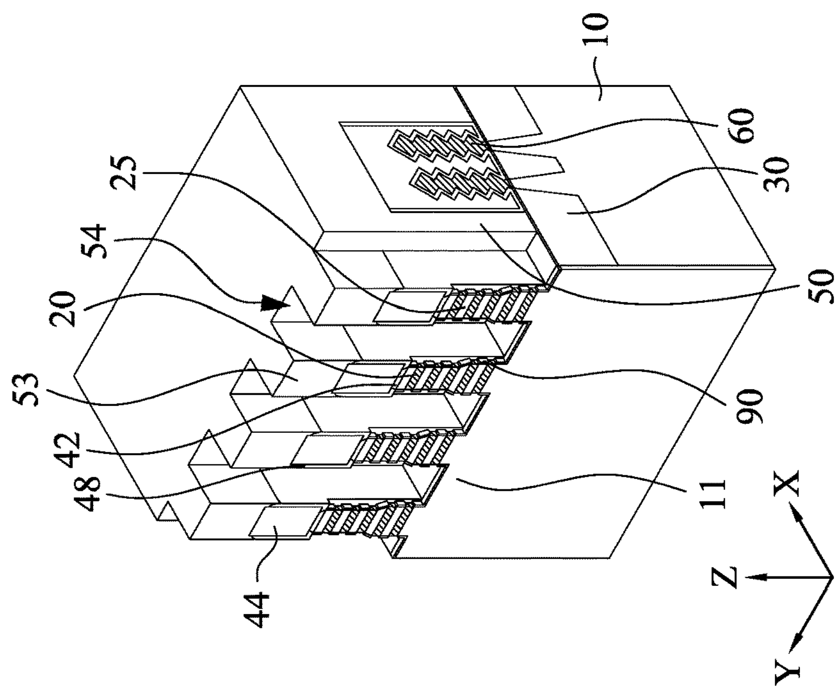
FIGS. 21A and 21B show one of the various stages of sequential manufacturing process of a GAA FET device according to other embodiments of the present disclosure.
Figure 21A:
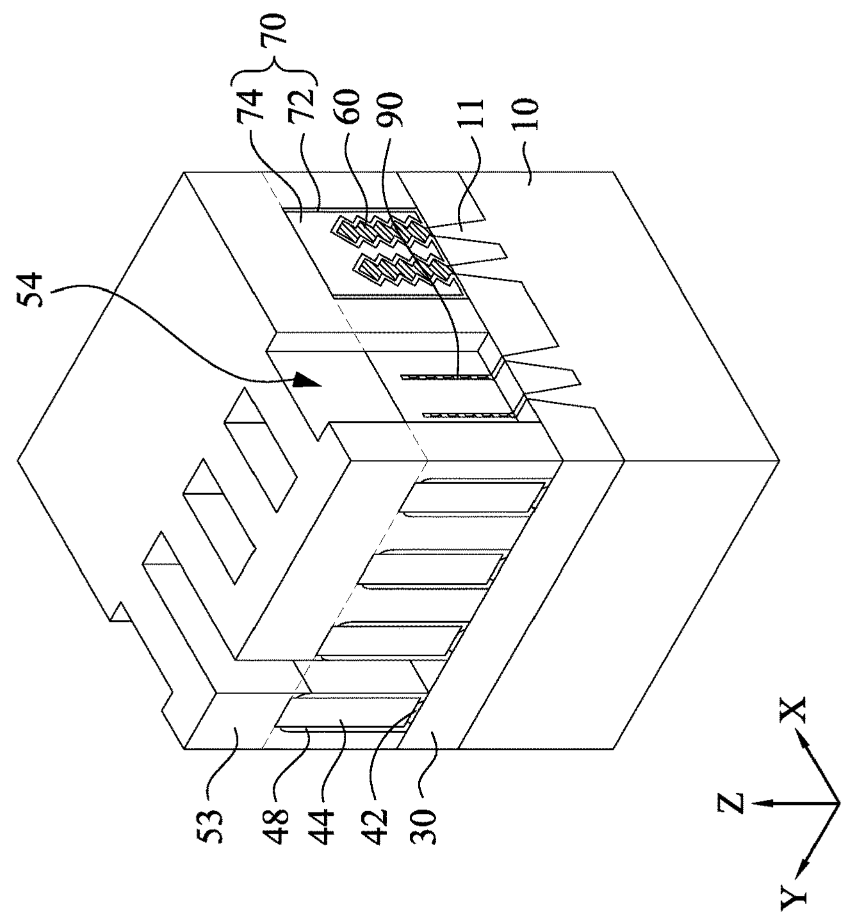
Figure 22B:
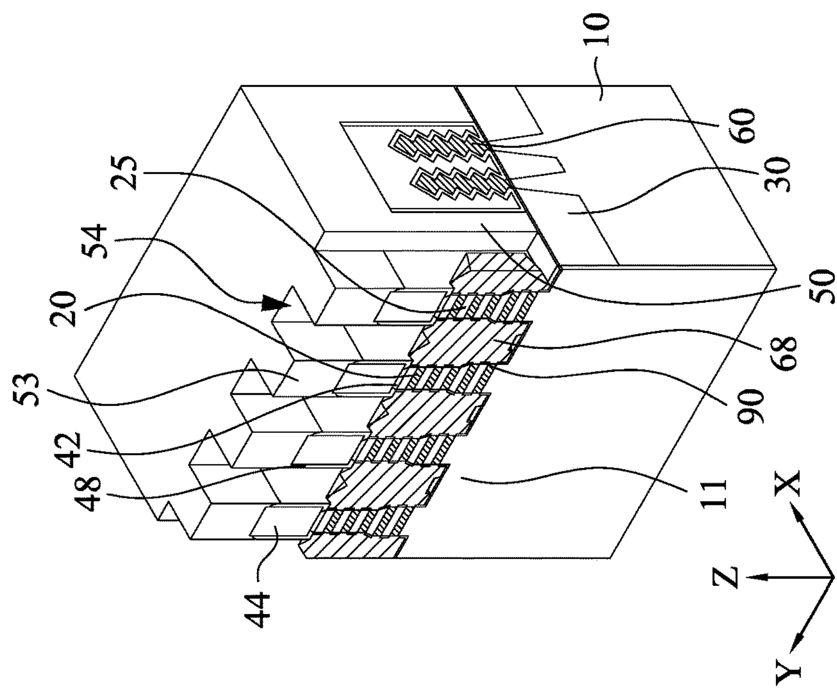
FIGS. 22A and 22B show one of the various stages of sequential manufacturing process of a GAA FET device according to other embodiments of the present disclosure.

FIGS. 21A and 22B show one of the various stages of sequential manufacturing process of a GAA FET device according to other embodiments of the present disclosure. After the structure shown in FIGS. 12A and 12B is formed, an oxidization operation is performed to selectively oxidize the first semiconductor layers 20.

In some embodiments, the oxidization operation includes applying water ($H_2O$) vapor to the end faces of the first semiconductor layers 20 and the second semiconductor layer 25. When the first semiconductor layers 20 are made of Ge and the second semiconductor layer 25 are made of SiGe, the oxidized portion of Ge (i.e., germanium oxide) is removed (dissolved) by the water vapor and thus silicon-germanium oxide 90 is selectively formed at the end of the second semiconductor layers 25. In some embodiments, atomic layer deposition using water vapor as precursor is used to form the silicon-germanium oxide 90. In some embodiments, the thickness of the silicon-germanium oxide 90 in the lateral direction (the Y direction) is in a range from about 0.1 nm to about 1 nm and is in a range from about 0.2 nm to about 0.5 nm in other embodiments.

Figure 22A:
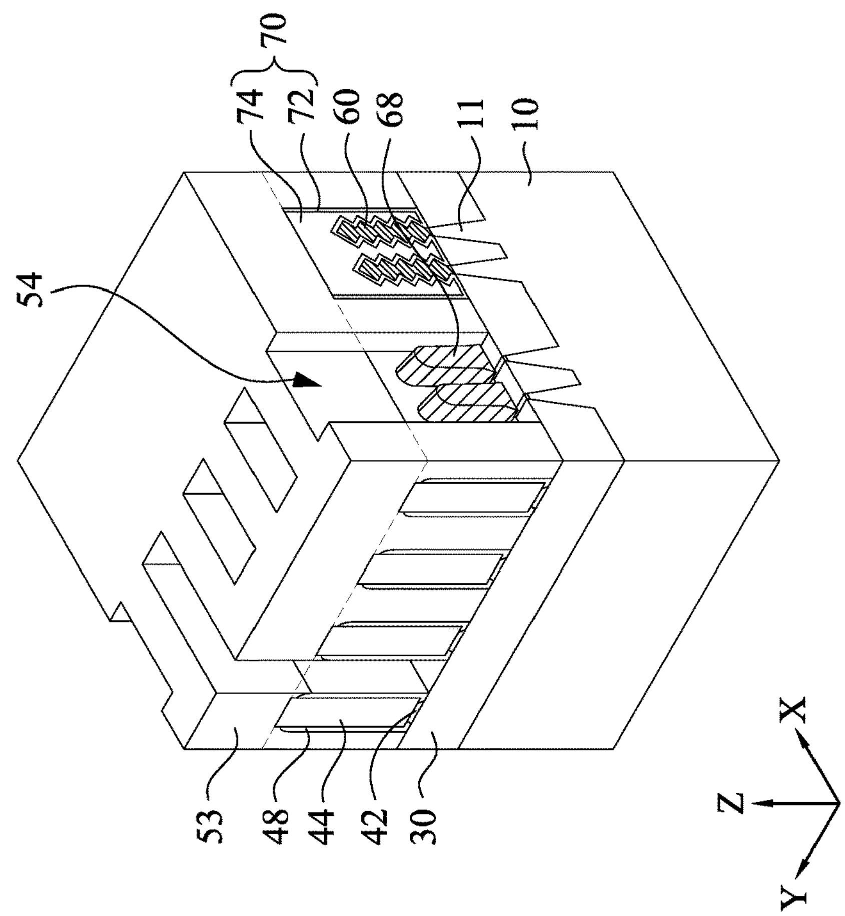

FIGS. 22A and 22B show one of the various stages of sequential manufacturing process of a GAA FET device according to other embodiments of the present disclosure. Then, as shown in FIGS. 22A and 22B, a source/drain epitaxial layer 68 is formed on the ends of the second semiconductor layers 25 and the silicon-germanium oxide 90. The epitaxial layer 68 includes one or more of Si and SiGe having a lower Ge concentration than the second semiconductor layers 25. In some embodiments, when the second semiconductor layers 25 are $Si_{1-z}Ge_z$, where z is in a range from about 0.4 to about 0.7, the source/drain epitaxial layer 68 is made of $Si_{1-w}Ge_w$, where w is smaller than z and is in a range from about 0 to about 0.3. In some embodiments, the source/drain epitaxial layer 68 is made of SiC. In some embodiments, as shown in FIGS. 22A and 22B, the source/drain epitaxial layer 68 is formed for respective fin structures, and separated from each other. In other embodiments, similar to FIGS. 17A and 17B, the source/drain epitaxial layer 68 is a merged structure shared by two fin structures. As shown in FIG. 22B, the source/drain epitaxial layer 68 is insulated and separated by the silicon-germanium oxide 90 from the first semiconductor layers 20.

Figure 23B:
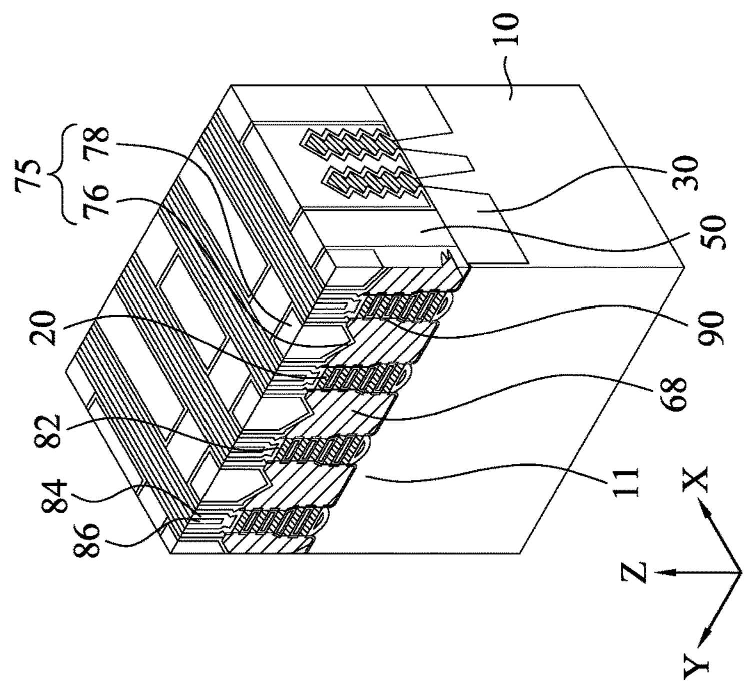
FIGS. 23A and 23B show one of the various stages of sequential manufacturing process of a GAA FET device according to other embodiments of the present disclosure.
Figure 23A:
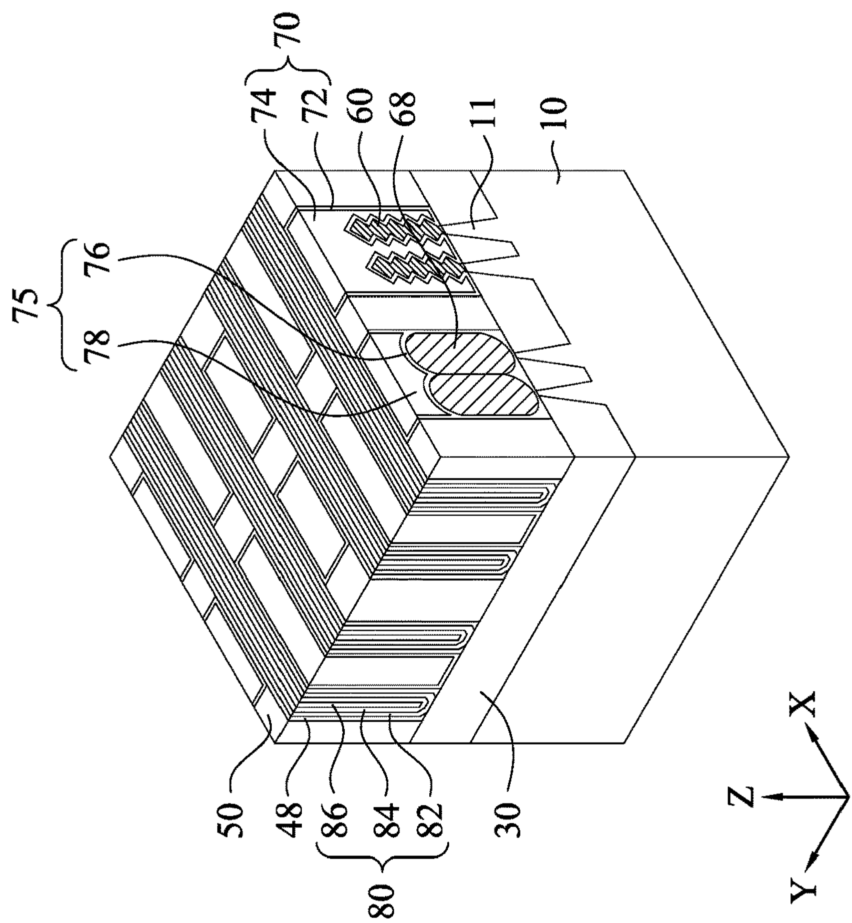

FIGS. 23A and 23B show one of the various stages of sequential manufacturing process of a GAA FET device according to other embodiments of the present disclosure. Subsequently, by operations same as or similar to those explained with respect to FIGS. 15A-15C, a conductive contact layer 75 and a metal gate structure 80 are formed. As shown in FIG. 23B, the source/drain epitaxial layer 68 is insulated and separated from the gate electrode (work function adjustment layer 84 and/or the gate electrode layer 86) by the gate dielectric layer 82 and the silicon-germanium oxide 90. In other words, the silicon-germanium oxide 90 functions as an inner spacer. It is understood that the GAA FETs undergo further CMOS processes to form various features such as contacts/vias, interconnect metal layers, dielectric layers, passivation layers, etc.

In other embodiments, the bottom fin layer 11 and the first semiconductor layer 20 (channel region) is made of $Si_{1-x}Ge_x$, the source/drain epitaxial layer 60 for a pFET is made of $Si_{1-x}Ge_x$, or GeSn, and the source/drain epitaxial layer 65 for an nFET is made of $Si_{1-y}Ge_y$, or SiC, where $0 \leq y < x \leq 1$. In certain embodiments, the bottom fin layer 11 and the first semiconductor layer 20 (channel region) are made of Ge, the source/drain epitaxial layer 60 for a pFET is made of GeSn, and the source/drain epitaxial layer 65 for an nFET is made of Si or SiC. In some embodiments, the first semiconductor layers 20 are not strained before the source/drain epitaxial layers are formed, and the source/drain epitaxial layer 60 made of GeSn applies compressive strain to the channel regions and the source/drain epitaxial layer 65 made of Si or SiC applies tensile strain to the channel regions.

In other embodiments, the bottom fin layer 11 and the second semiconductor layer 25 are made of Ge (channel region), the source/drain epitaxial layer 60 for a pFET is made of GeSn, the first semiconductor layer is made of SiGe, and the source/drain epitaxial layer 65 for an nFET is made of Si or SiC. In such a case, in the replacement gate process, the first semiconductor layers 20 are removed. In some embodiments, the second semiconductor layers 25 are not strained before the source/drain epitaxial layers are formed, and the source/drain epitaxial layer 60 made of GeSn applies compressive strain to the channel regions and the source/drain epitaxial layer 65 made of Si or SiC applies tensile strain to the channel regions.

It will be understood that not all advantages have been necessarily discussed herein, no particular advantage is required for all embodiments or examples, and other embodiments or examples may offer different advantages.

In accordance with one aspect of the present disclosure, a semiconductor device includes a gate-all-around field effect transistor (GAA FET). The GAA FET includes channel regions made of a first semiconductor material disposed over a bottom fin layer made of a second semiconductor material, and a source/drain region made of a third semiconductor material. The first semiconductor material is $Si_{1-x}Ge_x$, where $0.9 \leq x \leq 1.0$, and the second semiconductor material is $Si_{1-y}Ge_y$, where $y < x$ and $0.3 \leq y \leq 0.7$. In one or more of the foregoing and following embodiments, the GAA FET is a p-type FET, and the third semiconductor material is $Si_{1-w}Ge_w$, where $x \leq w$ and $0.9 \leq w \leq 1.0$. In one or more of the foregoing and following embodiments, x=w. In one or more of the foregoing and following embodiments, the first and third semiconductor materials are Ge. In one or more of the foregoing and following embodiments, the GAA FET is a p-type FET, and the third semiconductor material is GeSn. In one or more of the foregoing and following embodiments, each of the channel regions is compressive strained caused by lattice mismatch between the first semiconductor material and the second semiconductor material. In one or more of the foregoing and following embodiments, none of the channel regions is in contact with the bottom fin layer. In one or more of the foregoing and following embodiments, the GAA FET is an n-type FET, and the third semiconductor material is $Si_{1-z}Ge_z$, where $0 \leq z \leq 0.3$. In one or more of the foregoing and following embodiments, the first semiconductor material is Ge and the third semiconductor material is Si. In one or more of the foregoing and following embodiments, silicon-germanium oxide is disposed between the third semiconductor material and a gate dielectric layer. In one or more of the foregoing and following embodiments, the GAA FET is an n-type FET, and the third semiconductor material is SiC. In one or more of the foregoing and following embodiments, each of the channel regions is tensile strained caused by lattice mismatch between the first semiconductor material and the third semiconductor material.

In accordance with another aspect of the present disclosure, a semiconductor device includes a p-type gate-all-around field effect transistor (GAA FET) and an n-type GAA FET both disposed over a semiconductor substrate. The p-type GAA FET includes first channel regions made of a first semiconductor material disposed over a first bottom fin layer made of a second semiconductor material, and a first source/drain region including a first epitaxial layer made of a third semiconductor material. The n-type GAA FET includes second channel regions made of the first semiconductor material disposed over a second bottom fin layer made of the second semiconductor material, and a second source/drain region including a second epitaxial layer made of a fourth semiconductor material. The first semiconductor material is $Si_{1-x}Ge_x$, where $0.9 \leq x \leq 1.0$, the second semiconductor material is $Si_{1-y}Ge_y$, where $y<x$ and $0.3 \leq y \leq 0.7$, the third semiconductor material is GeSn or $Si_{1-w}Ge_w$, where $x \leq w$ and $0.9 \leq w \leq 1.0$, and the fourth semiconductor material is SiC or $Si_{1-z}Ge_z$, where $0 \leq z \leq 0.3$. In one or more of the foregoing and following embodiments, the first semiconductor material is Ge. In one or more of the foregoing and following embodiments, the third semiconductor material is Ge. In one or more of the foregoing and following embodiments, the fourth semiconductor material is Si. In one or more of the foregoing and following embodiments, the second source/drain region includes semiconductor wires made of $Si_{1-q}Ge_q$, where $q<x$ and $0.3 \leq q \leq 0.7$, and the second epitaxial layer wraps around each of the semiconductor wires. In one or more of the foregoing and following embodiments, the fourth semiconductor material is in contact with a gate dielectric layer. In one or more of the foregoing and following embodiments, silicon-germanium oxide is disposed between the fourth semiconductor material and a gate dielectric layer.

In accordance with another aspect of the present disclosure, a semiconductor device includes a p-type gate-all-around field effect transistor (GAA FET) and an n-type GAA FET both disposed over a semiconductor substrate. The p-type GAA FET includes first channel regions made of a first semiconductor material disposed over a first bottom fin layer made of a second semiconductor material, and a first source/drain region including a first epitaxial layer made of a third semiconductor material. The n-type GAA FET includes second channel regions made of the first semiconductor material disposed over a second bottom fin layer made of the second semiconductor material, and a second source/drain region including a second epitaxial layer made of a fourth semiconductor material. The first semiconductor material is $Si_{1-x}Ge_x$, where $0.9 \leq x \leq 1.0$, the second semiconductor material is $Si_{1-y}Ge_y$, where $0.9 \leq y \leq 1.0$, the third semiconductor material is GeSn or $Si_{1-w}Ge_w$, where $x \leq w$ and $0.9 \leq w \leq 1.0$, and the fourth semiconductor material is SiC or $Si_{1-z}Ge_z$, where $0 \leq z \leq 0.3$.

In accordance with one aspect of the present disclosure, in a method of manufacturing a semiconductor device, a multi-layer structure of first semiconductor layers and second semiconductor layers alternately stacked in a vertical direction is formed over a substrate. The multi-layer structure is patterned into a fin structure including first semiconductor layers and second semiconductor layers alternately stacked over a bottom fin structure. A sacrificial gate structure is formed over the fin structure. The sacrificial gate structure covers a first part of the fin structure and leaving a second part of the fin structure exposed, and the first part of the fin structure includes a channel region and the second part of the fin structure including source/drain regions. A source/drain epitaxial layer is formed in the source/drain region. The sacrificial gate structure is removed to expose the channel region. The second semiconductor layers are removed in the channel region thereby exposing the first semiconductor layers in the channel region. A gate dielectric layer and a gate electrode layer are formed around the first semiconductor layers in the channel region. The first semiconductor layers are made of $Si_{1-x}Ge_x$, where $0.9 \leq x \leq 1.0$, and the bottom fin structure is made of $Si_{1-y1}Ge_{y1}$, where $y<x$ and $0.3 \leq y1 \leq 0.7$. In one or more of the foregoing and following embodiments, the second semiconductor layers are made of $Si_{1-y2}Ge_{y2}$, where $y2<x$ and $0.3 \leq y2 \leq 0.7$. In one or more of the foregoing and following embodiments, $y1=y2$. In one or more of the foregoing and following embodiments, the first semiconductor layer is made of Ge. In one or more of the foregoing and following embodiments, the second semiconductor layers are removed from the source/drain region of the fin structure before the source/drain epitaxial layer is formed. The source/drain epitaxial layer wraps around the first semiconductor layers in the source/drain region. In one or more of the foregoing and following embodiments, the source/drain epitaxial layer is made of $Si_{1-z}Ge_z$, where $0.9 \leq z \leq 1.0$. In one or more of the foregoing and following embodiments, the source/drain epitaxial layer is made of GeSn. In one or more of the foregoing and following embodiments, the first semiconductor layers are removed from the source/drain region of the fin structure before the source/drain epitaxial layer is formed. The source/drain epitaxial layer wraps around the second semiconductor layers in the source/drain region. In one or more of the foregoing and following embodiments, the source/drain epitaxial layer is made of SiC or $Si_{1-z}Ge_z$, where $0 \leq z \leq 0.3$. In one or more of the foregoing and following embodiments, the source/drain region of the fin structure is removed before the source/drain epitaxial layer is formed. The source/drain epitaxial layer is formed on end faces of the first and second semiconductor layers. In one or more of the foregoing and following embodiments, the source/drain epitaxial layer is made of SiC or $Si_{1-z}Ge_z$, where $0 \leq z \leq 0.3$. In one or more of the foregoing and following embodiments, a thickness of each of the first semiconductor layers is less than a critical thickness and has no crystal dislocation. In one or more of the foregoing and following embodiments, before the source/drain epitaxial layer is formed, an interlayer dielectric layer is formed and the interlayer dielectric layer is patterned to expose the source/drain region.

In accordance with another aspect of the present disclosure, in a method of manufacturing a semiconductor device, a multi-layer structure of first semiconductor layers and second semiconductor layers alternately stacked in a vertical direction is formed over a substrate. The multi-layer structure is patterned into a fin structure including first semiconductor layers and second semiconductor layers alternately stacked over a bottom fin structure. A sacrificial gate structure is formed over the first and second fin structures. A first source/drain epitaxial layer is formed in a first source/drain region of the first fin structure. A second source/drain epitaxial layer is formed in a second source/drain region of the second fin structure. The sacrificial gate structure is removed to expose channel regions of the first and second fin structures. The second semiconductor layers are removed in the channel regions, thereby exposing the first semiconductor layers in the channel regions. A gate dielectric layer and a gate electrode layer are formed around the first semiconductor layers in the channel region. The first semiconductor layers are made of $Si_{1-x}Ge_x$, where $0.9 \le x \le 1.0$, the bottom fin structure is made of $Si_{1-y1}Ge_{y1}$, where $y1<x$ and $0.3 \le y1 \le 0.7$, the second semiconductor layers are made of $Si_{1-y2}Ge_{y2}$, where $y2<x$ and $0.3 \le y2 \le 0.7$, the first source/drain epitaxial layer is made of GeSn or $Si_{1-w}Ge_w$, where $x \le w$ and $0.9 \le w \le 1.0$, and the second source/drain epitaxial layer is made of SiC or $Si_{1-z}Ge_z$, where $0 \le z \le 0.3$. In one or more of the foregoing and following embodiments, before the first and second source/drain epitaxial layers are formed, one or more interlayer dielectric layers are formed, the one or more interlayer dielectric layers are patterned to expose the first source/drain region, the first source/drain epitaxial layer is formed, the one or more interlayer dielectric layers are patterned to expose the second source/drain region, and the second source/drain epitaxial layer is formed. In one or more of the foregoing and following embodiments, before the first source/drain epitaxial layer is formed, the second semiconductor layers are removed from the first source/drain region of the first fin structure. The first source/drain epitaxial layer wraps around the first semiconductor layers in the first source/drain region. In one or more of the foregoing and following embodiments, before the second source/drain epitaxial layer is formed, the first semiconductor layers are removed from the second source/drain region of the second fin structure. The second source/drain epitaxial layer wraps around the second semiconductor layers in the second source/drain region. In one or more of the foregoing and following embodiments, before the second source/drain epitaxial layer is formed, the second source/drain region of the second fin structure is removed. The second source/drain epitaxial layer is formed on end faces of the first and second semiconductor layers.

In accordance with another aspect of the present disclosure, in method of manufacturing a semiconductor device, a multi-layer structure of first semiconductor layers and second semiconductor layers alternately stacked in a vertical direction is formed over a substrate. The multi-layer structure is patterned into a fin structure including first semiconductor layers and second semiconductor layers alternately stacked over a bottom fin structure. A sacrificial gate structure is formed over the first and second fin structures. A first source/drain epitaxial layer is formed in a first source/drain region of the first fin structure. A second source/drain epitaxial layer is formed in a second source/drain region of the second fin structure. The sacrificial gate structure is removed to expose channel regions of the first and second fin structures. The second semiconductor layers are removed in the channel regions, thereby exposing the first semiconductor layers in the channel regions. A gate dielectric layer and a gate electrode layer are formed around the first semiconductor layers in the channel region. The first semiconductor layers are made of $Si_{1-x}Ge_x$, where $0.9 \le x \le 1.0$, the bottom fin structure is made of $Si_{1-y1}Ge_{y1}$, where $0.9 \le y1 \le 1.0$, the second semiconductor layers are made of $Si_{1-y2}Ge_{y2}$, where $0.9 \le y2 \le 1.0$, the first source/drain epitaxial layer is made of GeSn or $Si_{1-w}Ge_w$, where $x \le w$ and $0.9 \le w \le 1.0$, and the second source/drain epitaxial layer is made of SiC or $Si_{1-z}Ge_z$, where $0 \le z \le 0.3$. In one or more of the foregoing and following embodiments, the first semiconductor layers, the bottom fin structure and the second semiconductor layers are made of Ge, and the first source/drain epitaxial layer is made of GeSn.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a multi-layer structure of first semiconductor layers and second semiconductor layers alternately stacked in a vertical direction over a substrate;

patterning the multi-layer structure into a fin structure including the first semiconductor layers and the second semiconductor layers alternately stacked over a bottom fin structure;

forming a sacrificial gate structure over the fin structure, the sacrificial gate structure covering a first part of the fin structure and leaving a second part of the fin structure exposed, the first part of the fin structure including a channel region and the second part of the fin structure including source/drain region;

forming a source/drain epitaxial layer in the source/drain region;

removing the sacrificial gate structure to expose the channel region;

removing the second semiconductor layers in the channel region thereby exposing the first semiconductor layers in the channel region; and forming a gate dielectric layer and a gate electrode layer around the first semiconductor layers in the channel region, wherein:

the first semiconductor layers are made of $Si_{1-x}Ge_x$, where $0.9 \le x \le 1.0$, and the bottom fin structure is made of $Si_{1-y1}Ge_{y1}$, where $y<x$ and $0.3 \le y1 \le 0.7$.

2. The method of claim 1, wherein the second semiconductor layers are made of $Si_{1-y2}Ge_{y2}$, where $y2<x$ and $0.3 \le y2 \le 0.7$.

3. The method of claim 2, wherein $y1=y2$.

4. The method of claim 2, wherein the first semiconductor layer is made of Ge.

5. The method of claim 2, further comprising removing the second semiconductor layers from the source/drain region of the fin structure before the source/drain epitaxial layer is formed, wherein the source/drain epitaxial layer wraps around the first semiconductor layers in the source/drain region.

6. The method of claim 5, wherein the source/drain epitaxial layer is made of $Si_{1-z}Ge_z$, where $0.9 \le z \le 1.0$.

7. The method of claim 5, wherein the source/drain epitaxial layer is made of GeSn.

8. The method of claim 1, further comprising removing the first semiconductor layers from the source/drain region of the fin structure before the source/drain epitaxial layer is formed, wherein the source/drain epitaxial layer wraps around the second semiconductor layers in the source/drain region.

9. The method of claim 8, wherein the source/drain epitaxial layer is made of SiC or $Si_{1-z}Ge_z$, where $0 \le z \le 0.3$.

10. The method of claim 1, further comprising removing the source/drain region of the fin structure before the source/drain epitaxial layer is formed, wherein the source/drain epitaxial layer is formed on end faces of the first and second semiconductor layers.

11. The method of claim 10, wherein the source/drain epitaxial layer is made of SiC or $Si_{1-z}Ge_z$, where $0 \le z \le 0.3$.

12. The method of claim 1, wherein a thickness of each of the first semiconductor layers is less than a critical thickness and has no crystal dislocation.

13. The method of claim 1, further comprising, before the source/drain epitaxial layer is formed:

forming an interlayer dielectric layer;

patterning the interlayer dielectric layer to expose the source/drain region.

14. A method of manufacturing a semiconductor device, comprising:

forming a multi-layer structure of first semiconductor layers and second semiconductor layers alternately stacked in a vertical direction over a substrate;

patterning the multi-layer structure into a first fin structure and a second fin structure, the first and second find structures each including the first semiconductor layers and the second semiconductor layers alternately stacked over a bottom fin structure;

forming a sacrificial gate structure over the first and second fin structures;

forming a first source/drain epitaxial layer in a first source/drain region of the first fin structure;

forming a second source/drain epitaxial layer in a second source/drain region of the second fin structure;

removing the sacrificial gate structure to expose channel regions of the first and second fin structures;

removing the second semiconductor layers in the channel regions, thereby exposing the first semiconductor layers in the channel regions; and forming a gate dielectric layer and a gate electrode layer around the first semiconductor layers in the channel region, wherein:

the first semiconductor layers are made of $Si_{1-x}Ge_x$, where $0.9 \le x \le 1.0$, the bottom fin structure is made of $Si_{1-y1}Ge_{y1}$, where $y1 < x$ and $0.3 \le y1 \le 0.7$, the second semiconductor layers are made of $Si_{1-y2}Ge_{y2}$, where $y2 < x$ and $0.3 \le y2 \le 0.7$, the first source/drain epitaxial layer is made of GeSn or $Si_{1-w}Ge_w$, where $x \le w$ and $0.9 \le w \le 1.0$, and the second source/drain epitaxial layer is made of SiC or $Si_{1-z}Ge_z$, where $0 \le z \le 0.3$.

15. The method of claim 14, comprising, before the first and second source/drain epitaxial layers are formed:

forming one or more interlayer dielectric layers;

patterning the one or more interlayer dielectric layers to expose the first source/drain region;

forming the first source/drain epitaxial layer;

patterning the one or more interlayer dielectric layers to expose the second source/drain region; and forming the second source/drain epitaxial layer.

16. The method of claim 15, comprising, before the first source/drain epitaxial layer is formed, removing the second semiconductor layers from the first source/drain region of the first fin structure, wherein the first source/drain epitaxial layer wraps around the first semiconductor layers in the first source/drain region.

17. The method of claim 15, comprising, before the second source/drain epitaxial layer is formed, removing the first semiconductor layers from the second source/drain region of the second fin structure, wherein the second source/drain epitaxial layer wraps around the second semiconductor layers in the second source/drain region.

18. The method of claim 15, comprising, before the second source/drain epitaxial layer is formed, removing the second source/drain region of the second fin structure, wherein the second source/drain epitaxial layer is formed on end faces of the first and second semiconductor layers.

19. A method of manufacturing a semiconductor device, comprising:

forming a multi-layer structure of first semiconductor layers and second semiconductor layers alternately stacked in a vertical direction over a substrate;

patterning the multi-layer structure into a first fin structure and a second fin structure, the first and second fin structures each including the first semiconductor layers and the second semiconductor layers alternately stacked over a bottom fin structure;

forming a sacrificial gate structure over the first and second fin structures;

forming a first source/drain epitaxial layer in a first source/drain region of the first fin structure;

forming a second source/drain epitaxial layer in a second source/drain region of the second fin structure;

removing the sacrificial gate structure to expose channel regions of the first and second fin structures;

removing the second semiconductor layers in the channel regions, thereby exposing the first semiconductor layers in the channel regions; and forming a gate dielectric layer and a gate electrode layer around the first semiconductor layers in the channel region, wherein:

the first semiconductor layers are made of $Si_{1-x}Ge_x$, where $0.9 \le x \le 1.0$, the bottom fin structure is made of $Si_{1-y1}Ge_{y1}$, where $0.9 \le y1 \le 1.0$, the second semiconductor layers are made of $Si_{1-y2}Ge_{y2}$, where $0.9 \le y2 \le 1.0$, the first source/drain epitaxial layer is made of GeSn or $Si_{1-w}Ge_w$, where $x \le w$ and $0.9 \le w \le 1.0$, and the second source/drain epitaxial layer is made of SiC or $Si_{1-z}Ge_z$, where $0 \le z \le 0.3$.

20. The method of claim 19, wherein the first semiconductor layers, the bottom fin structure and the second semiconductor layers are made of Ge, and the first source/drain epitaxial layer is made of GeSn.

* * * * *